United States Patent [19]
Lee et al.

[11] Patent Number: 5,822,252
[45] Date of Patent: Oct. 13, 1998

[54] FLASH MEMORY WORDLINE DECODER WITH OVERERASE REPAIR

[75] Inventors: Peter W. Lee, Saratoga, Calif.; Hsing-Ya Tsao; Fu-Chang Hsu, both of Taipei, Taiwan

[73] Assignee: Aplus Integrated Circuits, Inc., Saratoga, Calif.

[21] Appl. No.: 676,066

[22] Filed: Jul. 5, 1996

Related U.S. Application Data

[63] Continuation-in-part of Ser. No. 645,630, May 14, 1996, Pat. No. 5,687,121, and Ser. No. 624,322, Mar. 29, 1996, Pat. No. 5,646,890, and Ser. No. 664,639, Jun. 17, 1996.

[51] Int. Cl.$^6$ .................................................. G11C 16/00
[52] U.S. Cl. ................................ 365/185.3; 365/185.23; 365/189.04; 365/230.05
[58] Field of Search .......................... 365/185.3, 185.23, 365/185.33, 185.22, 185.18, 189.05, 230.06, 189.04, 239.08, 230.03

[56] References Cited

U.S. PATENT DOCUMENTS

| | | | |
|---|---|---|---|
| 5,023,835 | 6/1991 | Akimoto et al. | 365/189.05 |
| 5,295,115 | 3/1994 | Furuya et al. | 365/230.08 |
| 5,394,373 | 2/1995 | Kawamoto | 365/230.08 |
| 5,455,789 | 10/1995 | Nakamura et al. | 365/185.23 |
| 5,511,034 | 4/1996 | Hirata | 365/189.05 |
| 5,563,827 | 10/1996 | Lee et al. | 365/185.33 |

*Primary Examiner*—Tan T. Nguyen
*Attorney, Agent, or Firm*—Flehr Hohbach Test Albritton & Herbert LLP

[57] ABSTRACT

The invention provides a flash memory and decoder with overerase repair that can provide three word line voltages to overcome the overerased problems. The wordline decoder includes a wordline latch that provides a high flexibility of erasing size so that single/multiple sub-wordlines, single/multiple wordlines, single/multiple block, and whole array can be erased simultaneously. An exemplary embodiment of a flash memory wordline decoder that can provide three voltages includes a plurality of voltage terminals to receive a plurality of voltages, a plurality of address terminals to receive a plurality of address signals, a procedure terminal to receive a procedure signal, and a plurality of output wordlines adapted to be coupled to a bank of flash transistors. The wordline decoder circuit is configured to decode the address signals and includes a plurality of latches coupled to the wordlines and configured to latch the wordlines and to provide one of a plurality of operational voltages on the wordlines to accomplish a predetermined operation responsive to the procedure signal. The plurality of voltage terminals are configured in a way that the high voltage required for erasure or for programming needs not be discharged in verification. Another exemplary embodiment provides a wordline decoder that provides three wordline voltages for verification and repairing, and also for erasure. Advantages of the invention include available full verifications for erasure, repairing and programming, tight cell threshold distribution, high efficiency repairing, no discharging the high voltage cells in verifications, full range verification voltages.

28 Claims, 24 Drawing Sheets

FLASH MEMORY WORDLINE DECODER WITH OVERERASE REPAIR

RELATED APPLICATIONS

This is a continuation in part of U.S. patent application Ser. No. 08/645,630 filed on May 14, 1996, now U.S. Pat. No. 5,687,121 U.S. patent application Ser. No. 08/624,322 filed on Mar. 29, 1996 now U.S. Pat. No. 5,645,890 and U.S. patent application Ser. No. 08/664,639 filed on Jun. 17, 1996 and incorporates the parent cases by reference.

FIELD

The present invention relates to a flash memory wordline decoder with overerase repair. In particular, the flash memory wordline decoder provides a latch function to prevent the memory cells already erased from being overerased and to repair those cells that become overerased.

BACKGROUND

A traditional flash memory is formed by rows and columns of flash transistors. A wordline decoder provides operational voltages to rows that are coupled to the gates of the transistors, while a bit line decoder provides operational voltages to columns that are coupled to the drain of the transistors. Since flash memories store the information based on the cell threshold levels, the cell threshold level is decreased by an operation often referred to as "erasure," and increased by an operation often referred to as "programming." An explanation of flash-type transistors and flash memories is provided in Yim, U.S. Pat. No. 5,109,361 assigned to SamSung. Moreover, a popular construction of flash memory arrays is a NOR-plane array. In such an array, when an unselected transistor is on, the selected transistor in the same column can not be read correctly.

Therefore, the cell's threshold of the erased state should be controlled within a limit (e.g. $0.5V<Vt\_cell<1V$), so that the unselected cells are shut off by the unselected word line voltage (e.g. 0V). However, in known flash memories, some cells can be "overerased" and result in cells having a threshold below the lowest limit (e.g. 0.5V). When this occurs, the unselected cells will be on and will lead to an erroneous read data for the selected cell.

Known flash memories attempt to solving the overerase problem by repairing overerased cells. This technique identifies the overerased cells and to programs the cell thresholds back to the correct erased state limitation (e.g. $0.5V<Vt<1V$). However, the repair approaches proposed by the known techniques are not satisfactory. Because the overerased cells result in erroneous read data, the overerased cells can not be properly identified. Although some known techniques attempt to identify the overerased cells, the results can be wrong. As reported by U.S. Pat. No. 5,237,535 assigned to Intel, properly erased cells can be misidentified and repaired.

Additionally, each cell threshold after erasure and repairing can not be adequately verified. Therefore, the threshold dispersion can be large, and the repairing result is not guaranteed. The overerased cells also increase the difficulty of pumping the drain voltage required for repairing. Because the overerased cells always conduct current leakage from drain to source, it is difficult to maintain the drain voltage. These problems become worse when low VDD supply voltage or multi-level cells are used. Because these applications require tighter erased threshold limitation, the erasure and repairing of the known techniques can fail in meeting the requirements.

Goals of the invention are to overcome the identification problems and provide a flash memory wordline decoder to shut off the overerased cells after erasure and repairing so that the overerased cells can be completely identified and repaired. Another goal of the invention is to provide the wordline decoder with a full range of read voltages, (e.g. 0V–HV) so that the cells threshold in each step, such as after erasure, repairing and programming can be directly verified. Note that the conventional wordline decoder has a limitation that the read voltage can not be lower than the threshold of a PMOS transistor. As a result, a cell threshold in the erased state (e.g. 0.5V~1V) can not be verified. That results in some known techniques that require reference cells, where some expand the erased state range and some do not have the verification. Those techniques lead to other well-known drawbacks. Another goal of the invention is to provide the erasing and repairing approaches with tight threshold control. Thus, the invention is suitable for low VDD supply voltage such as 1.5V and multi-level cell applications.

SUMMARY

The invention provides a flash memory and decoder with overerase repair that can provide three word line voltages to overcome the overerased problems. The benefits of the application of three wordline voltages for solving the overerase problems are described below. The wordline decoder includes a wordline latch that provides a high flexibility of erasing size so that single/multiple sub-wordlines, single/multiple wordlines, single/multiple block, and whole array can be erased simultaneously. An exemplary embodiment of a flash memory wordline decoder that can provide three voltages includes a plurality of voltage terminals to receive a plurality of voltages, a plurality of address terminals to receive a plurality of address signals, a procedure terminal to receive a procedure signal, and a plurality of output wordlines adapted to be coupled to a bank of flash transistors. The wordline decoder circuit is configured to decode the address signals and includes a plurality of latches coupled to the wordlines, where the latches are configured to latch the wordlines and to provide one of a plurality of operational voltages on the wordlines to accomplish a predetermined operation responsive to the procedure signal. The plurality of voltage terminals are configured in a way that the high voltage required for erasure or for programming, which is stored in a high capacitance well, needs not be discharged in verification.

The exemplary embodiments can be combined with a voltage pump generator. A voltage pump generator provides operational voltages that are derived from the supplied voltages. For example, if the memory is supplied with 1.5V, and needs +10V for a program function, the voltage pump generator creates the required voltage and provides it to the decoder circuits to accomplish the necessary function. Likewise, the voltage pump can provide a negative voltage to the decoder circuits for the program function.

Another exemplary embodiment provides a wordline decoder that provides three wordline voltages for verification and repairing, and also for erasure.

Advantages of the invention include available full verifications for erasure, repairing and programming, tight cell threshold distribution, high efficiency repairing, no discharging the high voltage cells in verifications, full range verification voltages. Other functions such as embedding erased word line scanning and searching for the lowest cells threshold are included to enhance the performance of the invention. These advantages and the function are described in detail below.

BRIEF DESCRIPTION OF THE FIGURES

Additional advantages of the invention will become apparent upon reading the following detailed description and upon reference to the figures, in which.

DETAILED DESCRIPTION

Exemplary embodiments are described with reference to specific configurations. Those skilled in the art will appreciate that various changes and modifications can be made while remaining within the scope of the claims. For example, the invention can be used with any type of flash memory using Fowler-Nordheim (F-N) and channel hot electron (CHE) for erase and programming. Note that the traditional decision that an erased state is a low threshold transistor and that a programmed state is a high threshold transistor is arbitrary. In the exemplary embodiments, an erased state is considered to be one where the transistor has a low threshold while a programmed state is considered one where the transistor has a high threshold, however, the invention can also be practiced with alternate states. All electrical parameters are given by example and can be modified with good results. For example, in the exemplary embodiments, a supply voltage (VDD) is considered as 5V, but could alternatively be 3V, 1.5V or other supply voltage. If a different supply voltage is chosen, the various operational voltage levels would be modified to reflect the different supply voltage.

FLASH MEMORY ARCHITECTURE

Figure 1:
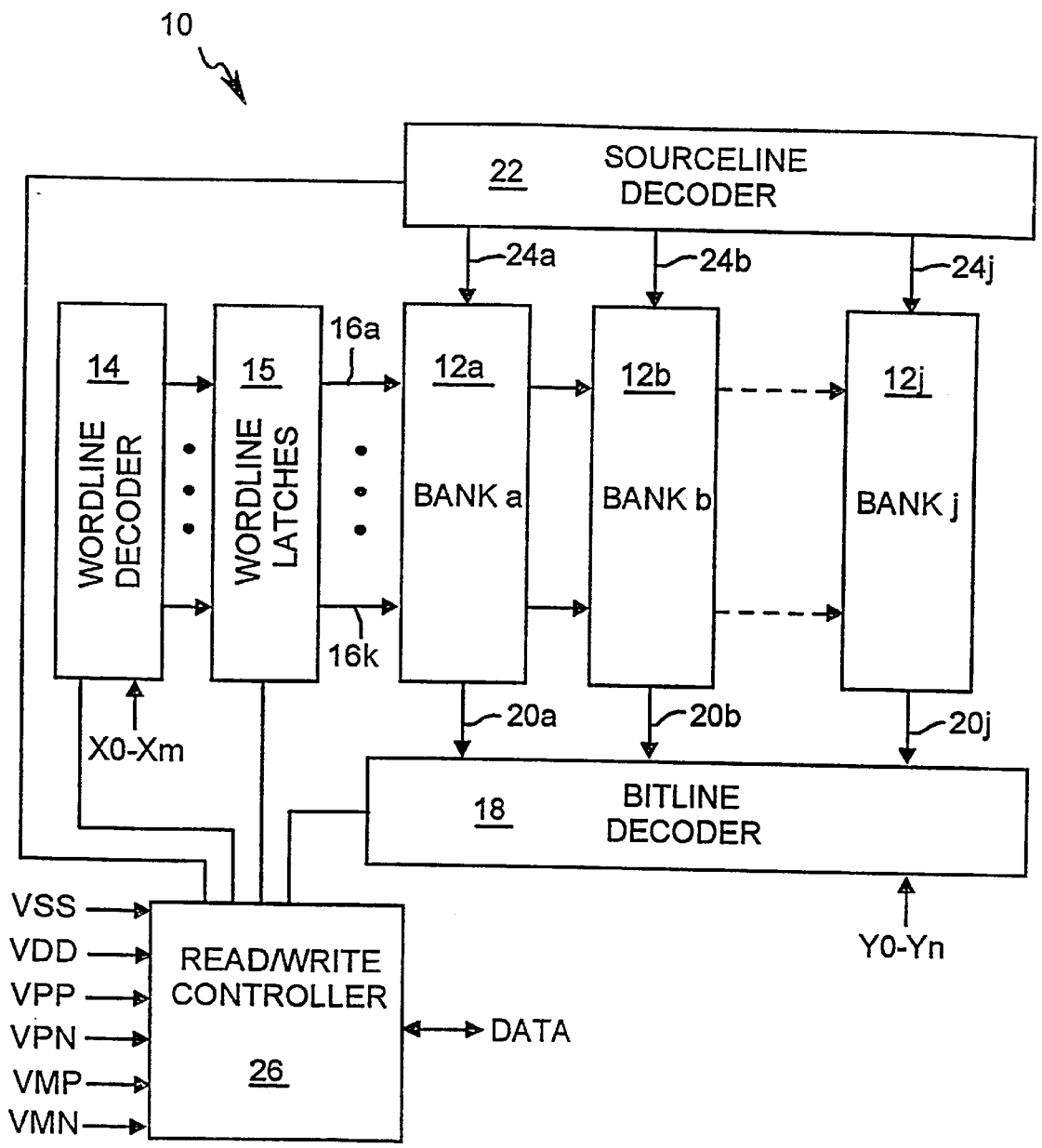
FIG. 1 depicts a multi-bank flash memory incorporating an embodiment of the invention.
Figure 2:
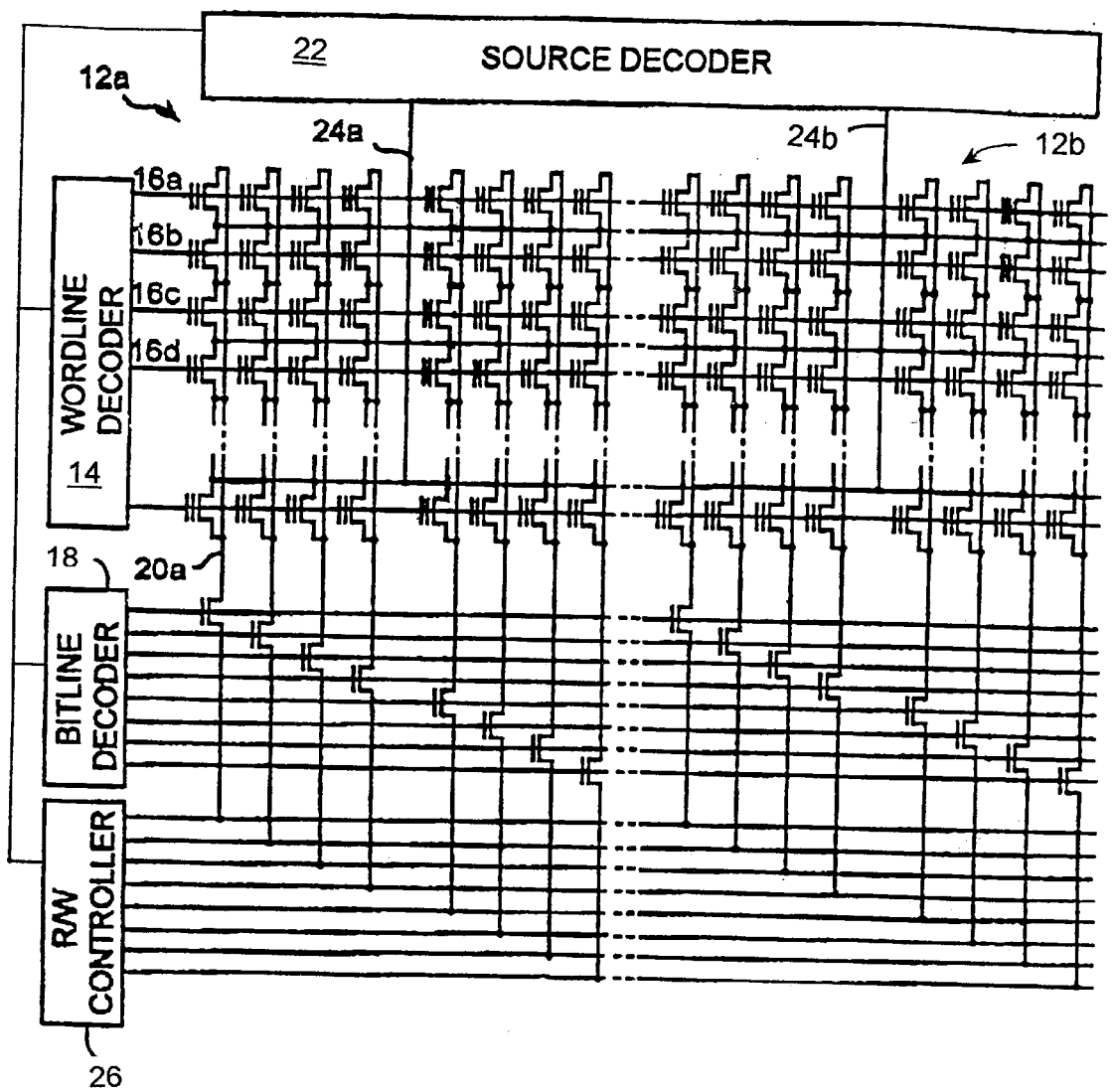
FIG. 2 depicts a well known NOR transistor array for a bank.

FIG. 1 depicts a flash memory 10 incorporating an embodiment of the invention. Flash memory 10 includes a plurality of banks 12a–j that store information. Each bank is constructed similar to a traditional flash transistor array, with rows and columns of flash transistors configured in a NOR-plane as shown in FIG. 2. Alternately, other transistor configurations can be used such as a NAND-plane.

A wordline decoder 14 is coupled to each of the banks 12a–j. Wordline decoder 14 receives an address input X0–Xm and decodes the X0–Xm input to activate a wordline 16a–k. Ordinarily, wordlines 16a–k includes a plurality of wordlines (WL0–WLk) where k represents 2 raised to the power m. That is, a design using 4 address lines X0–X3 will provide 16 wordlines WL0–WL15. When wordline decoder 14 is addressed by X0–Xm, a corresponding wordline WL0–WLk is activated.

A bitline decoder 18 is coupled to each of the banks 12a–j. Bitline decoder 18 receives an address input Y0–Yn and decodes the Y0–Yn input to couple selected bitlines 20a–j from a selected bank to read/write controller 26. Ordinarily, the bitline (e.g., 20a) includes a plurality of bitlines (BL0–BLq) where q represents a stored word that is usually 8 bits, 16 bits, 32 bits or other number of bits that represents a word to a processor.

A sourceline decoder 22 is also coupled to each of the banks 12a–j. Sourceline decoder is controlled by read/write controller 26 to selectively apply predetermined voltages to sourcelines 24a–j.

Both wordline decoder 14 and bitline decoder 18 are provided with the operational voltages VPN, VSS, VDD, VPP, VPI and others if necessary from read/write controller 26. In order to read, program and erase the memory, the voltages are selectively applied to selected flash memory cells as described below.

ERASE OPERATION

For clarity of description, wordlines have three general categories: unerased, selected, and unselected. The definition of each are as follows:

Unerased—the wordlines were not erased in the erase operation;

Unselected—the wordlines were erased, but not selected for verifying and repairing;

Selected—the wordline was erased, and is selected for verifying and repairing.

Because the erasing is based on multiple-wordlines or multiple-block, the wordlines not selected to be erased are called unerased wordlines. After erasing, all the erased wordlines are verified and repaired one by one until all are verified and repaired. When verifying (or repairing), the selected wordline is applied with the verify (or repair) voltage. The unselected wordlines and the unerased wordlines are applied with inhibit voltages (e.g. 0V in known techniques). However, 0V will not shut off possible over-erased cells on the unselected wordlines. Thus, the invention provides a new approach to shut off the over-erased cells on the unselected wordlines.

The novel technique is described with reference to the FIG. 3 flowchart and the FIGS. 4A–D flash transistor bank 12a. In step 30, an erase procedure begins from a multiple-wordline (or multiple-block) selection. The desired wordlines are latched in the wordline decoder as shown in FIG. 4A. In step 32, an erase voltage is applied to the latched wordlines according to FIG. 4B. The latched wordlines are erased simultaneously with a negative high voltage pulse (e.g. −10V) to the wordlines and a high voltage (e.g. 5V) to the drain. After the erase pulse, all the erased wordlines are discharged from (−10V) to a negative voltage (adjustable, e.g. −4V) to shut off possible over-erased cells, while all the unerased wordlines remains on a low voltage (e.g. 0V) to shut off the unerased cells as shown in FIG. 4C. Note that if the unerased word lines are applied with the negative voltage, the cells in programmed state may break down when repairing, due to the high voltage difference between the floating gate and the drain. Therefore, the wordline decoder should be able to provide three voltages (One positive, one zero, one negative) rather than two voltages (one positive, one negative) to overcome the overerase problem. The negative voltage is decided by an operation called "smart negative wordline voltage control." The lowest Vt of all the erased cells is found and the negative voltage is generated to a little bit lower than the lowest Vt to guarantee to shut off all the erased cells.

Because the multiple erased wordlines (or blocks) are randomly selected, each erased wordline should be identified to be verified and repaired sequentially. This is performed in step 34 using an embedded operation called "scan" to minimize off-chip control. The erased wordline address requires no memory by either the off-chip controller or a on-chip register. Alternatively, an on-chip sequencer (counter) generates wordline address from the first one to the last one to search for those wordline voltage is (−4V).

Figure 4A:
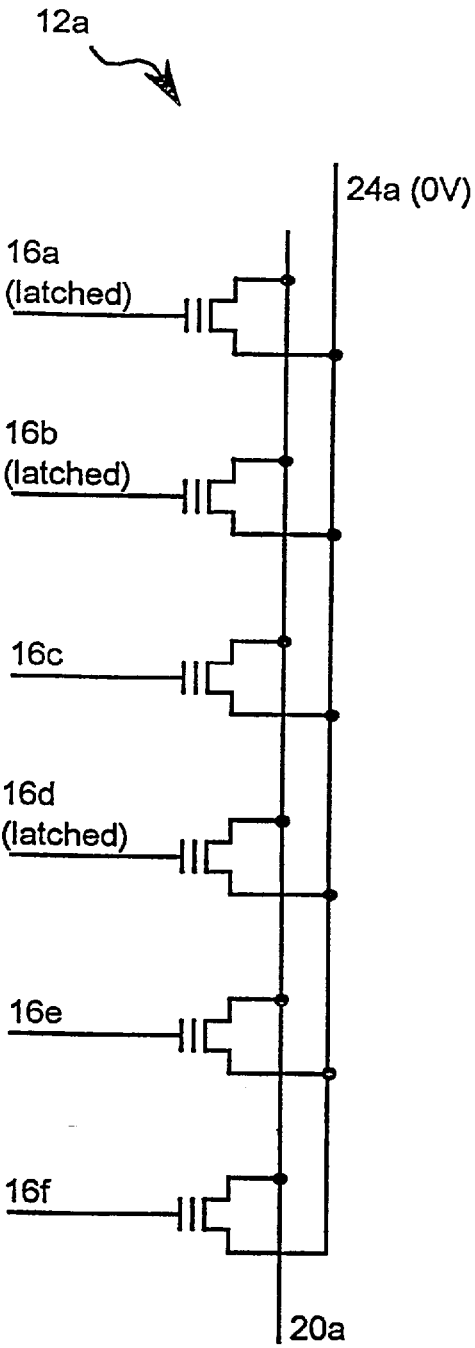
FIGS. 4A–D depict exemplary voltages for a read operation, an erase operation, an erase-verify operation and a repair operation.
Figure 4B:
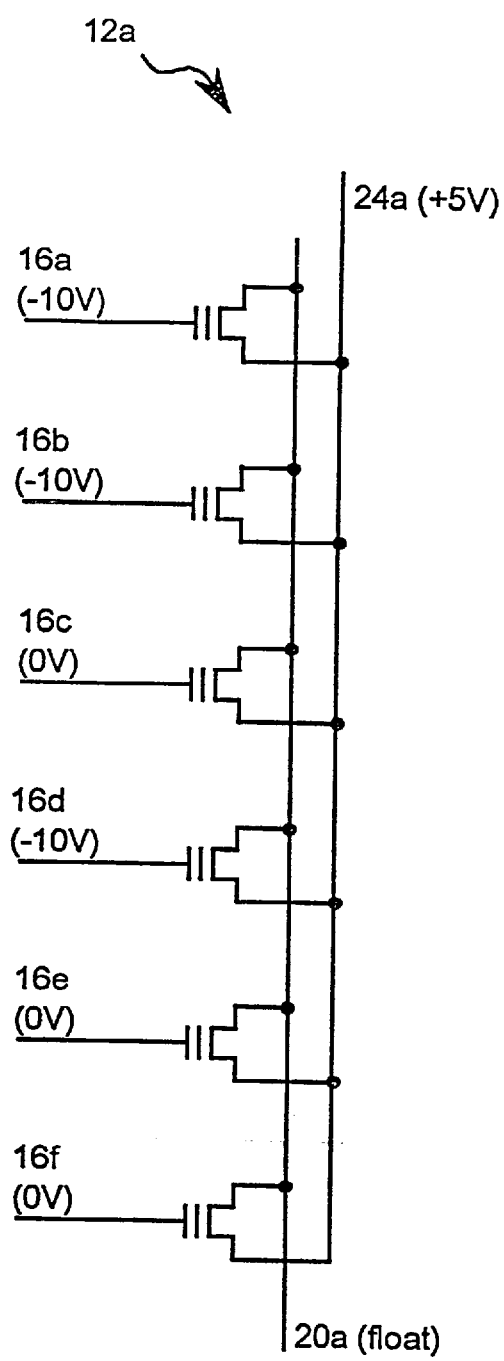
Figure 4C:
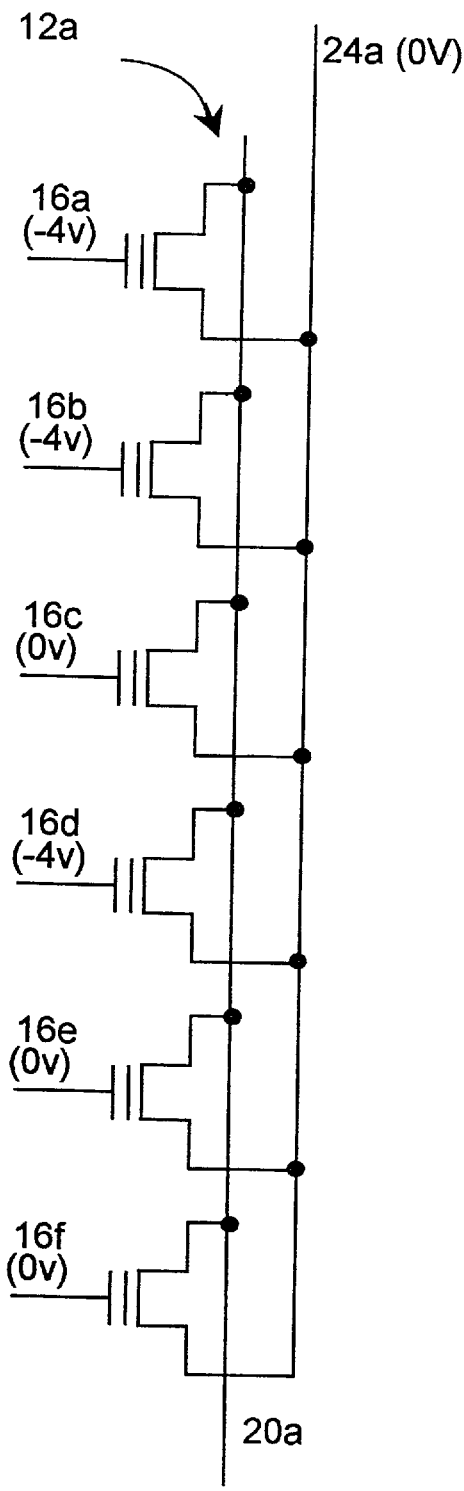
Figure 4D:
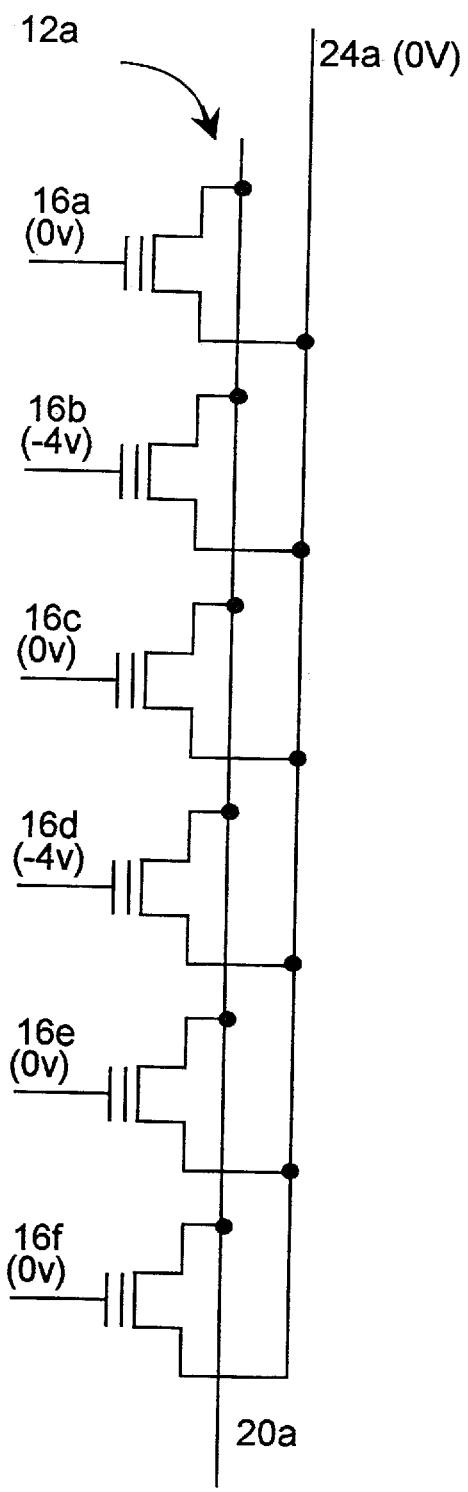

In step 36, when the first erased wordline is found, the first verification, erase-verify, is proceed to check if all the wordline cells' Vt are lower than the maximum erased-state Vt (e.g. 1V). The verify voltage (1V) is applied to override the (−4V) stored in the wordline latch. All the cells on this wordline are read based on either byte or page, depends on how many sense amplifiers are utilized. If the cells pass the verification, the wordline voltage (−4V) is reset to 0V to indicate an unerased wordline. This is depicted in FIG. 4D where wordline 16a is set to 0V to indicate that it passed the erase verify step. If not, the wordline voltage remains at (−4V) to indicate an erased wordline.

Once all the cells pass the verification, the second verification, over-erase-verification step 38 is performed for the same wordline to identify the over-erased cells. An over-erase-verify voltage (the minimum erased-state Vt, e.g. 0.5V) is applied to override the wordline voltage.

If all the cells are not over-erased, that means both the erase-verify and over-erased-verify are successful, and all the erased cells' Vt distribution are from 0.5V to 1V, the sequencer will find the next erased wordline (step 38). The wordline voltage is changed to 0V automatically, because the voltage level of the latch has been flipped to high by the verify voltage. Thus, the wordline will not be erased in the next erase pulse.

If any cells are over-erased, the cells need to be repaired. This is performed in step 40 where a repair voltage pulse (e.g. 5V) is applied to the wordline to repair the cells. The over-erased cell is identified by the bit line voltage. Referring to Flash Memory Read Write Controller, U.S. patent Ser. No. 08/664,639 assigned to Aplus Integrated Circuits when the verification fails, the bit line latch of the column sets the bit line voltage required for repairing (e.g. 5V) automatically, while the other bit lines are 0V.

In step 42, a repair-verify voltage (e.g. 0.5V) is then applied to the wordline to check if the over-erased cells are repaired. The repair verification is actually the same as the over-erase verification. If the wordline is repaired, the sequencer will search for the next erased wordline. The wordline will automatically change to 0V. If not, the repair/repair-verify operation is repeated until all the cells pass the verification. If any cell still fails after a predetermined number of repair cycles, a failure flag is set. The sequencer then searches for the next erased wordline.

After the erase cycle, a program operation is performed. The program operation is performed in a conventional manner.

WORDLINE DECODER

Figure 5A:
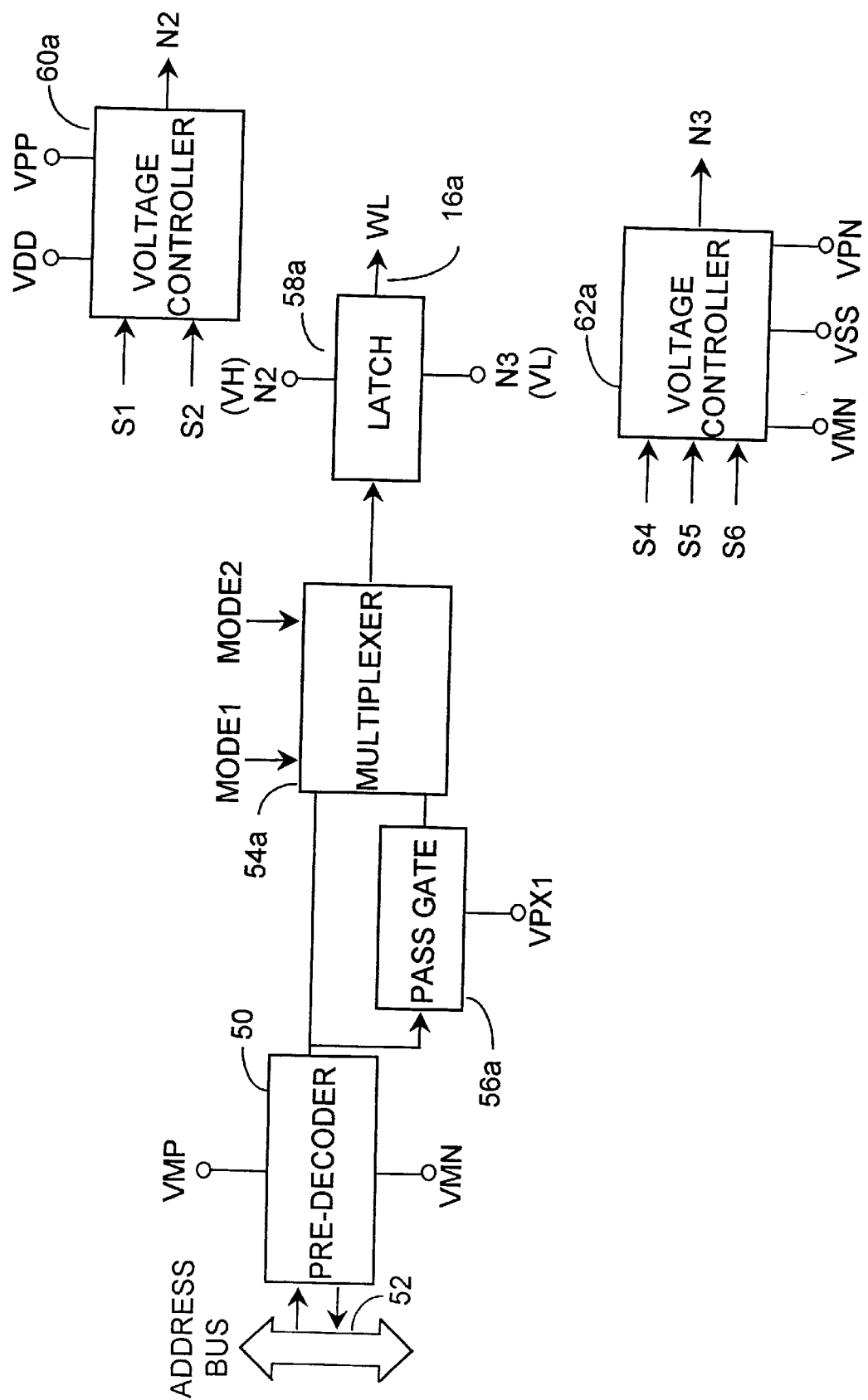
FIGS. 5A–B depict internal components of the wordline decoder circuit of FIG. 1.
Figure 5B:
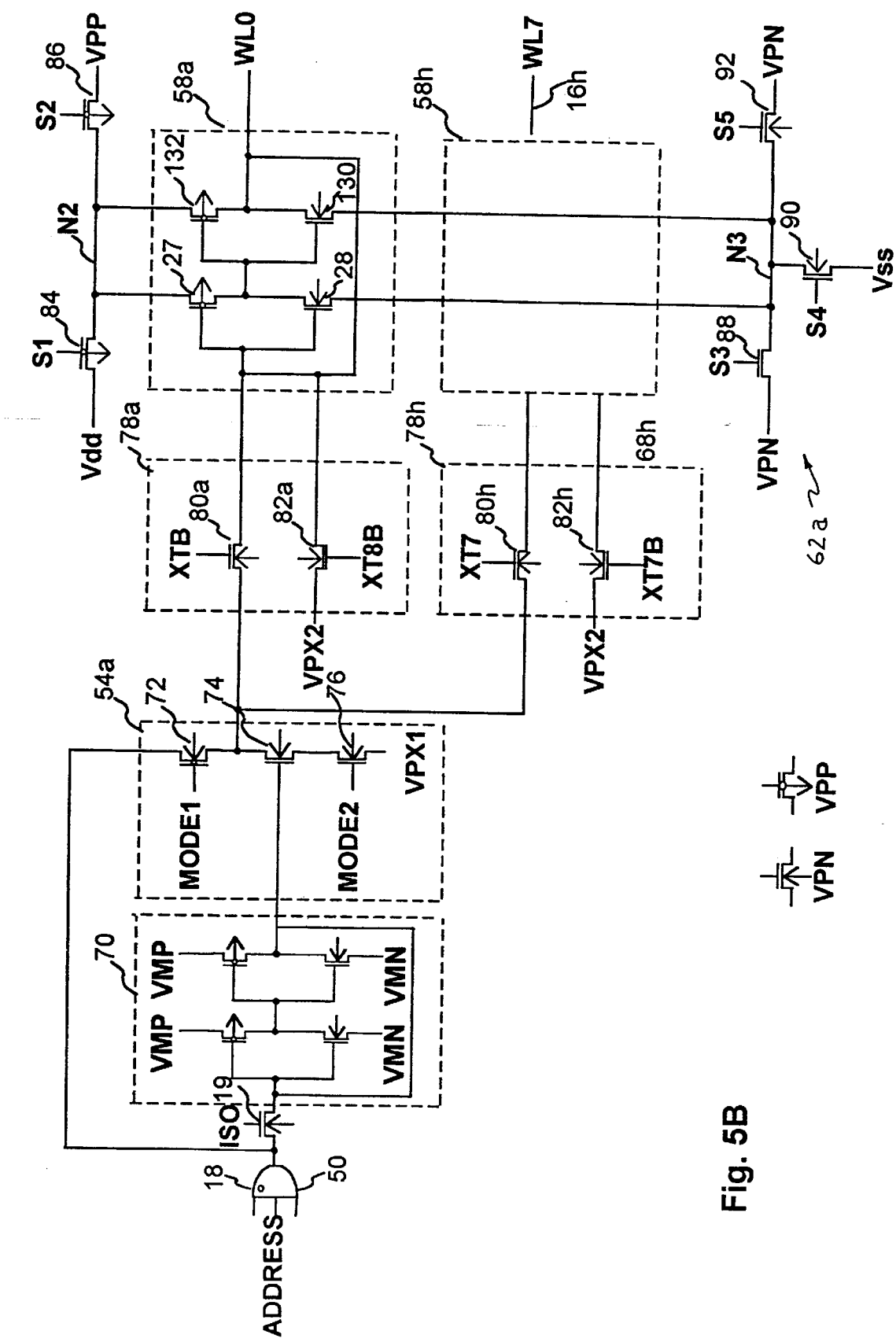

To perform the functions described above, wordline decoder 14 incorporates several novel features. FIGS. 5A–B depict internal components of wordline decoder 14. In practice, a flash memory will have a large number of cells. In order to identify the selected cells, the address lines X0–Xm and Y0–Yn need to be decoded to identify the selected word. The wordline decoder circuit determines which wordline is selected. Since there are a large number of cells, there will be a large number of address lines to decode. In order to accommodate a large number of address lines, a predecoder 50 is used as shown in FIG. 5A. Predecoder 50 receives an address over the address bus 52 and identifies the wordline 16a–k corresponding to the address.

FIG. 5A also depicts a multiplexer 54 coupled to predecoder 50. Multiplexer 54 receives two mode signals, MODE1 and MODE2. A latch 58 receives the output of multiplexer 54 and also voltage inputs N2 and N3. These voltage inputs provide latch 58 with operational voltages to provide on wordline 16a when required.

Referring to FIG. 5B, wordline latches 58a–h are shown in detail. This construction includes a latch-type level shifter 70 coupled to the output of predecoder 50. Multiplexer 54a further contains transistors 72, 74 and 76 for mode-selection. Voltage controller 60a controls the high-level voltage of the source (N2) while voltage controller 62a controls the low-level voltage of the source (N3). Voltage controllers 60a and 62a are global circuitry. The functions of all the circuits are described below.

A significant feature of the invention is an individual latch for each wordline. Latch 58a has at least four novel features. The first is that the wordline 16a is directly driven by the input of the latch to minimize the delay in read operation. The second is that the input to the latch is multiplexed by transistors 72 and 74. The input can be controlled by either the predecoder 50 (off, on) or the transistor 74 (off, on), corresponding to two operation modes. Using the two modes, the wordline 16a can be single-selected as conventional, or can be multiply selected. A detailed explanation of the multiple selection is given below under the heading TWO OPERATION MODES. The third is that the voltage sources for latch 58a are separated from the wells (VPP, VPN) of the latch. In erase-verifying and program-verifying operations, the wordline can be applied with different verify voltages without discharging the high voltage required for erasing and programming stored in the wells. A detailed explanation is given below under the heading NO DISCHARGING HIGH VOLTAGE WELLS FOR VERIFY. The fourth is that the latch of the selected wordline can be applied with a third voltage for verifying or repairing, while the latches of the other wordlines supply two voltage levels to the unselected wordlines and unerased wordlines. A detailed explanation is given below under the heading THREE WORDLINE VOLTAGES: HIGH, LOW, AND NEGATIVE.

TWO OPERATION MODES: SINGLE AND MULTIPLE SELECT

The invention has two operation modes. The first mode is single-select mode and the second mode is multiple-select. The mode is controlled by a multiplexer 54a that receives mode selection input signals MODE1 and MODE2.

The single-select mode is used in the read, program, and the program-verify operations as shown in TABLE 1. In this mode, a single wordline is selected, like conventional memories. To setup this mode, the transistors 72, 74 are on, off respectively and the predecoder 50 is directly coupled to N1. Only one wordline is selected (high) and the others are unselected (low).

TABLE 1

| Init | select WL | erase | scan | E.verify | reset | O.E.verify | repair |
|---|---|---|---|---|---|---|---|
| multi | multi | | multi | multi | single | multi | single | single |

The multiple-select mode is used in the erase, erase-verify, over-erase-verify, repair, and repair-verify operations as shown in TABLE 1. In this mode, any number of the wordlines can be randomly selected. To setup this mode, the transistors 80a–h and 82a–h are off, on respectively and VPX2 is high. Thus, all the latches 58a–h are initialized to the unselected state (high, in erase operation). Then, the transistors 72 and 76 are off, on respectively, then the wordline latches 58a–h are controlled by transistor 74.

When a wordline is selected, the transistor 74 is on and the selected latch is reset by VPX1 (low). When the address changes, the transistor 74 is off and the state of the latch 58a does not change. Thus, multiple wordline can be selected to latch the erase-state.

The multiple-selection can be based on either wordline or block. For multiple-wordline erasing, the predecoder 50 selects a block, and the second decoder 78a–h and 80a–h select a wordline in the block. For multiple-block erasing, all the second decoder transistors 80a–h and 82a–h are on, off respectively, thus all the latches 58a–h of the selected block latch the erase-state. Although a block has eight wordlines as shown in FIG. 5B, the number of the wordlines can be varied.

With the multiple-wordline/multiple-block selection, the erased size has much higher flexibility than the conventional block erase. Moreover, the operation complexity is reduced. For the fixed size block-erase, the unerased data should be read out from the erased-block before the erasing, stored in another memory, and then written back after erasing.

MULTIPLE-WORDLINE/MULTIPLE-BLOCK ERASE

After the erased latches are selected, the second decoder transistors 80a–h and 82a–h are all off to isolate latches 58a–h. Then, the transistors 84 and 86 are off, on respectively and VPP is 0V to pass 0V to source (N2). The transistors 88, 90 and 92 are off, off, on respectively and VPN is pumped to negative high voltage (e.g. −10V) to pass the negative high voltage to source (N3). The selected latches (low state) will pass the voltage of (N2) to the erased wordlines, and the unselected latch (high state) will pass the voltage of (N3) to the unerased wordlines. After predetermined time, the transistors 88, 90 and 92 are changed to off, on, off respectively to discharge the source (N3). The procedure is called an erase pulse and serves to iteratively erase the selected cells.

SEPARATED SOURCE AND WELL OF OUTPUT TRANSISTORS

Flash memories use high voltage for erasing and programming. When the power supplied to the memory is lower than the required high voltage, the high voltage must be generated on-chip. A well-known positive charge-pump circuit can generate the required positive high voltage (e.g. 10V) for programming, and a negative charge-pump circuit can generate the negative high voltage (e.g. −10V) for erasing. The generated positive high voltage must be stored in a large-capacitance N-well (VPP), and the negative high voltage must be stored in a large-capacitance P-well (VPN). The high voltage will be supplied to the selected wordlines by wordline decoders. To minimize the chip size, the high voltage are stored in the P-well and the N-well of the output transistors of the wordline decoders.

Figures 7A, 7B:
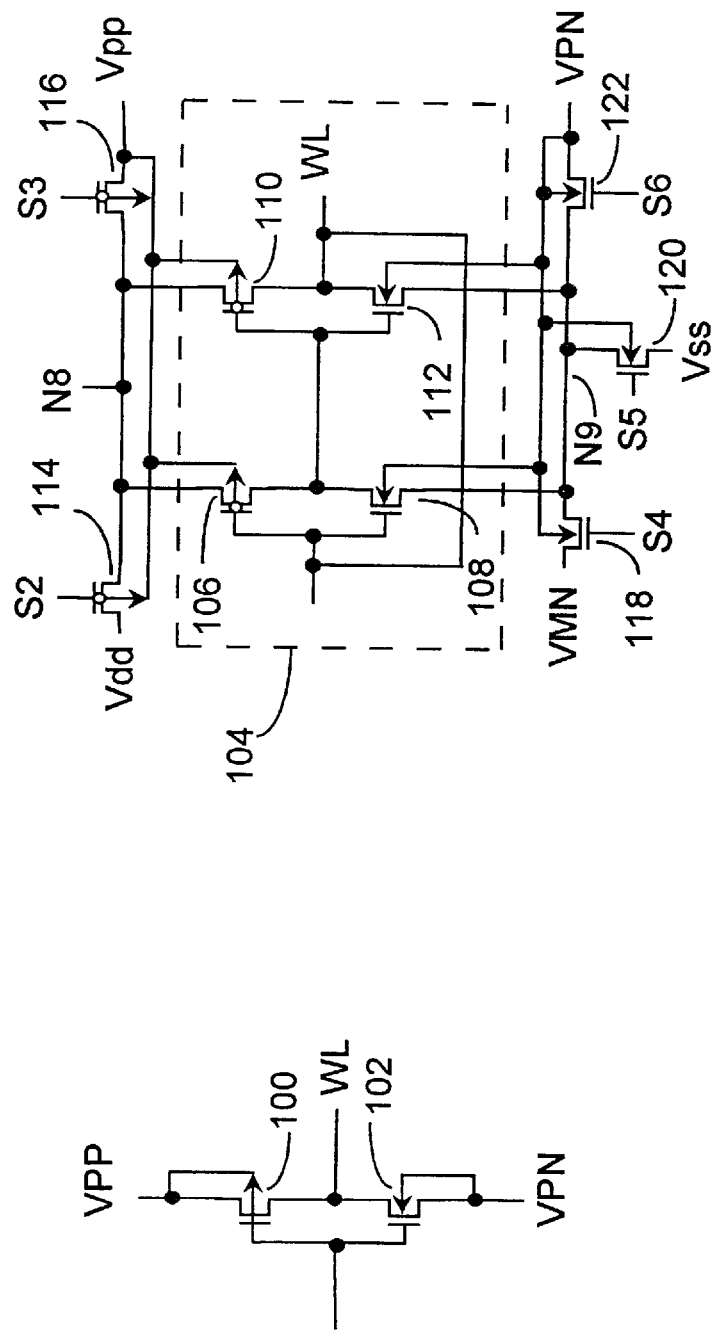
FIGS. 7A–B depict latches for use with an embodiment of a flash memory wordline decoder.

Referring to FIG. 7A, in known flash memories, the wordline voltage is controlled by the output transistors 100 and 102. The source of transistor 100 is connected to the high voltage well VPP, and the source of transistor 102 is connected to the low voltage well VPN, directly. Therefore, the wells have to be charged and discharged all the time to change the wordline voltage.

One of the advantageous features of this invention is the separated source and well of the output transistors. Referring to FIG. 7B, the wordline voltage is controlled by the latch 104. The positive high voltage and the negative high voltage are stored in the N-well and the P-well of the output transistors 106, 108, 110 and 112. However, the sources N8 and N9 are separated from the well (VPP, VPN). The sources voltage are controlled by transistors 114, 116, 118 and 120. A detailed explanation of the source controller is given below under the heading SOURCE VOLTAGE CONTROLLER. The advantage of using a separated source and well is also described below.

SOURCE VOLTAGE CONTROLLER

Referring to FIG. 7B, the sources (N8, N9) are separated from the high-voltage well (VPP, VPN) by transistors 116 and 120. Thus, the voltages to the sources can be changed without changing the voltage in the well. Moreover, the source capacitance is minimized by separating from the large-capacitance wells. The source (N8) can be applied with VDD or VPP by the transistors 114 and 116, and the source (N9) can be applied with VSS, VPN, and VMN (negative medium) by transistors 118, 120 and 122. Note that, although the exemplary embodiment only shows three voltage terminals (VMN, VPN, VSS) coupled to N9 and two voltage terminals (VPP, VDD) coupled to N8, any number of voltage terminals can be used, depending on the application requirements.

NO DISCHARGING HIGH VOLTAGE WELLS FOR VERIFY

As mentioned before, in the known techniques, the wordline voltage is supplied from the large-capacitance wells (VPP, VPN). Thus, when erase-verify or program-verify, the wells need to be discharged to the verify voltages. Because the verify iterations could be repeated from several hundred (typical) to several thousand (maximum) times. Thus, the well has to be charged and discharged for the same number of times. As a result, the time and the power consumption are drastically increased in pumping the wells.

The invention has improved this drawback. Because the sources (N8, N9) are separated from the wells (VPP, VPN). Thus, the wordline voltage can be changed by only discharging and charging the low-capacitance sources, without discharging the wells.

The only drawback of this method is that the body effects of the transistors 106 through 122 increase, leading to the increasing of the charging and discharging time. However, compared with the time spent on pumping the high-capacitance wells (mini-second range), the time spent on charging and discharging the wordlines (nanosecond range) is very short.

SMART CONTROL OF THE NEGATIVE WORDLINE VOLTAGE

After an erasing pulse, all the erased wordline are discharged from the negative high voltage to a negative voltage, because there may be over-erased cells appearing in the erasing.

The negative voltage is adjustable. It is determined by the lowest Vt of the over-erased cells. Although some known references, for example U.S. Pat. No. 5,335,198, suppose that the lowest Vt of over-erased cells is about −4V, it is well known that the lowest Vt varies from chip to chip. Alternatively, the invention uses a novel approach to detect the lowest Vt of the array, then applies a voltage lower than the Vt to the erased wordlines. Thus, the voltage is low enough to shut off all the over-erased cells but not over-stress the cells.

Referring to FIG. 5B, supposing WL0 (16*a*) is erased. When erasing, the transistors 88, 90 and 92 are off, off, on respectively. The negative high voltage VPN (e.g. −10V) is supplied to WL0 by transistors 92 and 130. To detect the lowest Vt of the erased cells, the transistors 88, 90 and 92 are off, on, off respectively and WL0 is discharged from the negative high voltage to VSS gradually. Once the wordline voltage is higher than the lowest Vt, the cell having the lowest Vt will be turned on. Bit line sense amplifiers will detect the on-cell, and turn off transistor 90 to stop the discharging.

Note that at this time, the wordline voltage is higher than the lowest cell's Vt now, thus it needs to be pumped lower to shut off the cell. To reduce the time and power consumption in pumping, the invention uses another smart way to lower the voltage in a short time.

When discharging WL0 to VSS, the VMN is also discharged but kept a predetermined voltage lower than WL0. Therefore, when the lowest Vt is detected by sense amplifiers, transistors 88, 90 and 92 are off, off, off, similar to the above description. Then, the transistors 88, 90 and 92 are on, off, off to discharge WL0 to VMN. The configuration eliminates the time to pumping WL0 to VMN.

If there is no over-erased cell, all the cells will be off all the way, and the final erased wordline voltage will be VSS.

EMBEDDED SCANNING MULTIPLE ERASED WORDLINES

After the negative voltage is determined and applied to all the erased wordlines the erased wordlines are verified and repaired one by one. The randomly multiple-selected wordlines should be found sequentially. The invention uses a novel embedded algorithm called "scanning" to automatically check the state of each wordline latch. Thus, the erased wordlines can be found without storing the addresses in registers, or reloading the addresses by a off-chip controller. For the known techniques, because they do not have wordline latches, or they do not have a read path from the wordline, the erased wordlines addresses should be reloaded all the time.

Referring to FIG. 5B, to setup the scanning operation, the transistors 72, 76 are off, on respectively. When scanning the erased wordlines, an on-chip sequencer (counter) generates addresses from the first wordline to the last wordline of the array. Supposing that WL0 is selected, the transistors 74 and 80*a* are on, and the state of the latch 58*a* is read from VPX1. If the state is unerased (high state), the sequencer will increment the address. If the state is erased (low state), the following steps will be proceeded.

THREE WORDLINE VOLTAGES: HIGH, LOW, AND NEGATIVE

Once an erased wordline is found, the steps will be proceeded to erase-verify, over-erase-verify, and, if needed, repair the over-erased cells. One of the biggest challenge of the invention is to supply the voltages for these steps to the selected wordline, while the other wordlines' voltages remains unchanged. For clarity, the voltages of the selected wordline is called the third voltage.

The exemplary wordline voltages are summarized below:

Selected: A low voltage (e.g. 1V) for erase-verify, a low voltage (e.g. 0.5V) for over-erase-verify, and a high voltage (e.g. 5V) for repairing are sequentially applied to the selected wordline.

Unerased: A low voltage (e.g. 0V) is applied to the unerased wordlines to shut off all the unerased cells.

Unselected: A negative voltage (adjustable) is applied to the unselected wordlines to shut off all the unselected cells, including possible over-erased cells.

The embodiment A and embodiment B use different approaches to supply the third voltage. These embodiments are described below:

EMBODIMENT A

Embodiment A directly overrides the previous wordline voltage with the third voltage. Referring to FIG. 5B, the transistors 72 and 76 are off, on (the same as the previous scanning step). The third voltage is applied by VPX1.

This approach is a kind of ratio-type design. When the third voltage is applied to latch 58*a*, the latch will be flipped then the gate of transistor 132 will latch the negative voltage, and transistor 132 will be on. Therefore, there is a current leakage from WL0 to N2. The wordline voltage will be determined by both the third voltage VPX1 and the current leakage.

To reduce the leakage current, the resistance of the transistor 132 is increased by two ways. The first, because source (N2) and well (VPP) is separated, the well (VPP) can be applied with VDD while source (N2) is applied with 0V to increase the body-effect. The second, the channel length of transistor 132 is prolonged. With a (W/L) ratio about 8, the leakage current of the worst case (when repairing, WL0 is about 5V and N2 is about 0V) can be reduced to 30 microamps. The current is very small compared with the known techniques which have current leakage conducted by the over-erased cells. When repairing, every cell may conduct several hundred microamps.

EMBODIMENT B

Figure 6A:
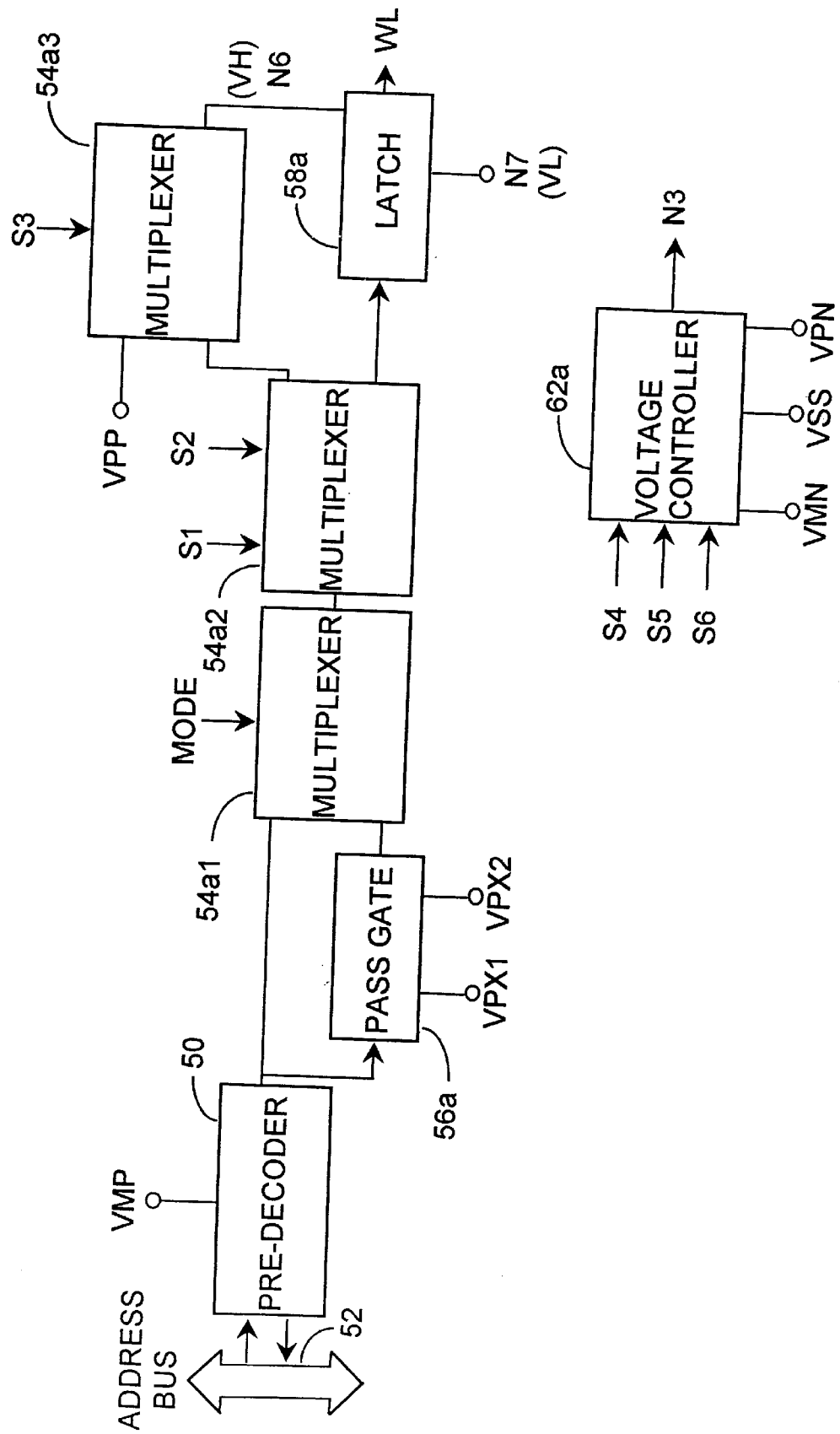
FIGS. 6A–B depict internal components of the wordline decoder circuit of FIG. 1.
Figure 6B:
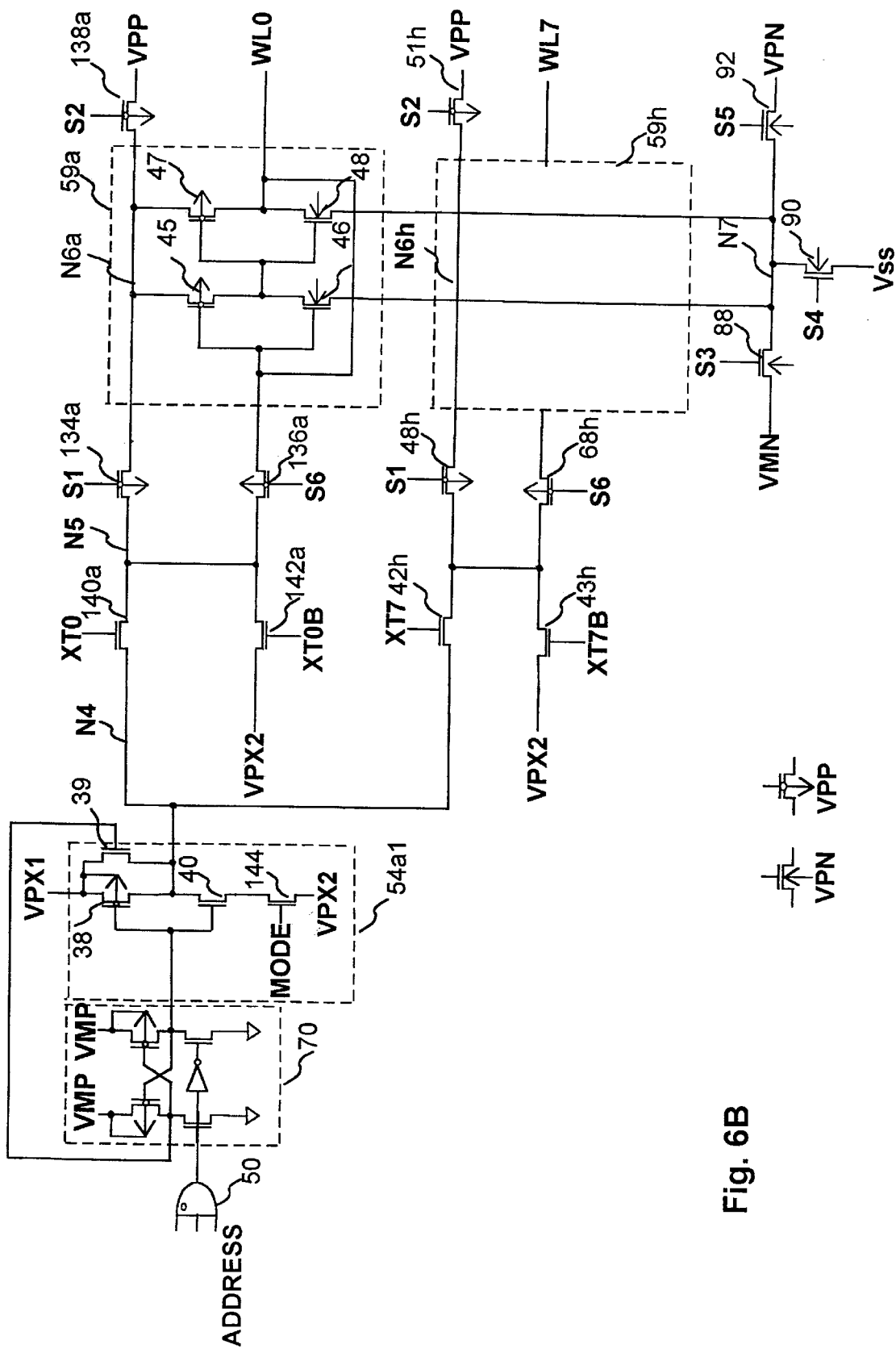

Embodiment B uses a different approach to apply the third voltage. In the embodiment A, all the latches 58a–h has a common source (N2). Referring to FIG. 6B, in embodiment B, each latch 59a–h has an individual high-level source (N6a–h) and a common low-level source (N7). Where transistors 88, 90 and 92 are global circuitry.

For regular two-voltage supply, transistors 134a–h, 136a–h and 138a–h are off, on, on. Thus, all the high-level sources (N6a–h) of the wordlines are applied with the voltage VPP. In reading, VPP is VDD, and in programming, VPP is pumped to the high voltage. The transistors 88, 90 and 92 are off, on, off, thus low-level source (N7) is applied with VSS. With the transistors 136a–h on, the selected wordline can pass VPP and unselected wordlines pass VSS to the wordlines.

For three-voltage supply, transistors 134a–h, 136a–h and 138a–h are on, off, on. Thus, all the high-level sources (N6a–h) are isolated from VPP, and connected to the individual (N5) of each wordline. The (N5) is decoded by predecoder 50 and second decoder 140a–h, 142a–h. In this mode, transistor 144 is on. The selected wordline will pass VPX1, and the unselected wordlines will pass VPX2 to N5. Because transistors 136a–h are off, the state of the latch 59a–h will not be flipped.

The voltages of the (selected, unselected) wordlines are supplied by (VPP, N7). For three-voltage supply, the transistors 88, 90 and 92 are on, off, off. The voltages of the (selected, unselected, unerased) wordlines are supplied by (VPX1, VPX2, N7).

In the other words, the high-level source (N6a–h) is decoded for the three-voltage supply. The selected wordline and unselected wordline are applied by VPX1 and VPX2, respectively. The advantage of this circuit is that the current leakage in the embodiment A is eliminated.

THREE VERIFICATIONS: ERASE, OVER-ERASE, AND REPAIR

The invention provides complete erase verification, over-erase verification, and repair verification. As mentioned above, a block-erase operation may generate over-erased cells. Any over-erased cell will lead to wrong verification results. Therefore, once a block-erase operation is proceeded, any verification result should be unbelievable; unless the art can shut off the over-erased cells, like the invention.

Verifications are a key issue for low VCC application and multi-level cells. Because, for these applications, the acceptable erased Vt is lower, the Vt distribution should be tightly controlled by verifications.

Erasing and repairing without verifications lead to large Vt dispersion. For example, the erase-state Vt of the known techniques (U.S. Pat. No. 5,237,535) disperses from 3V to 0.5V. Thus, the known techniques are not suitable for the above two applications.

FULL RANGE OF VERIFY VOLTAGES

Except the existence of over-erased cells, another key issue for over-erase-verify is the difficulty to supply low verify voltage. The over-erase-verify voltage is low (e.g. 0.5V) because it is the minimum Vt of the erase-state.

None of the known techniques directly applies the low voltage to verify an individual cell's Vt. They either applied high voltage to both the cells and reference cells to sense the differential current, or do not have over-erase verification.

For those known techniques using a P-channel device to supply the high voltage, and a N-channel device to supply the low voltage, the minimum verify voltage can be applied to the selected wordline is Vtp (the threshold of P-channel devices). For that reason, some known technique (U.S. Pat. No. 4,841,482) try to apply the low voltage from the N-channel device. Unfortunately, when the N-channel device supplies the low verify voltage to the selected wordline, the P-channel device can not supply an even lower voltage to unselected wordlines. As a result, all the wordlines are applied with the low voltage together. Thus, the known technique can only detect if all the cells' Vt are higher than the verify voltage, but not for any individual cell. This leads to an large Vt dispersion.

Referring to FIG. 5B, the invention supplies all the verify voltages and repair voltage from VPX1. The transistors 72 and 76 are off, on. VPX1 passes through transistors 76, 74 and 80a to the selected wordline. Because all the transistors are N-channel devices, the low verify voltage down to 0V can be supplied. When repairing, the repair voltage is adjustable. When a voltage higher than VDD is applied (for speeding up the repairing), the control voltages of the transistors 76, 74 and 80a will be pumped to pass the repair voltage.

The invention also provide another function that the verify voltage can be negative. By using level-shifters to generate the control voltages of the transistors 76, 74 and 80a, negative verify voltage can be applied to the selected wordline. Therefore, the invention has a full range of verifying and repairing voltages from negative to positive.

ALL THE CELLS' Vt IN THE ARRAY CAN BE MEASURED

The invention provides the function of measuring any individual cell's Vt from the array. As mentioned in the discussion of THREE VERIFICATIONS, the invention can supply any verify voltage. Thus, all the cells' Vt after each operation can be measured from the array. This function is significant, because the Vt distribution after each operation is important for a flash memory.

However, none of the known techniques can measure the cells' Vt, because they can not supply the low voltage or negative voltage to a selected wordline. Thus, such data provided by the known techniques showing the over-erased cells' Vt can not be measured from the array, but from some test chips. Consequently, the real data of a production chip can not be obtained.

ERASING CAN BE STOPPED FOR INDIVIDUAL WORDLINE

Figure 3:
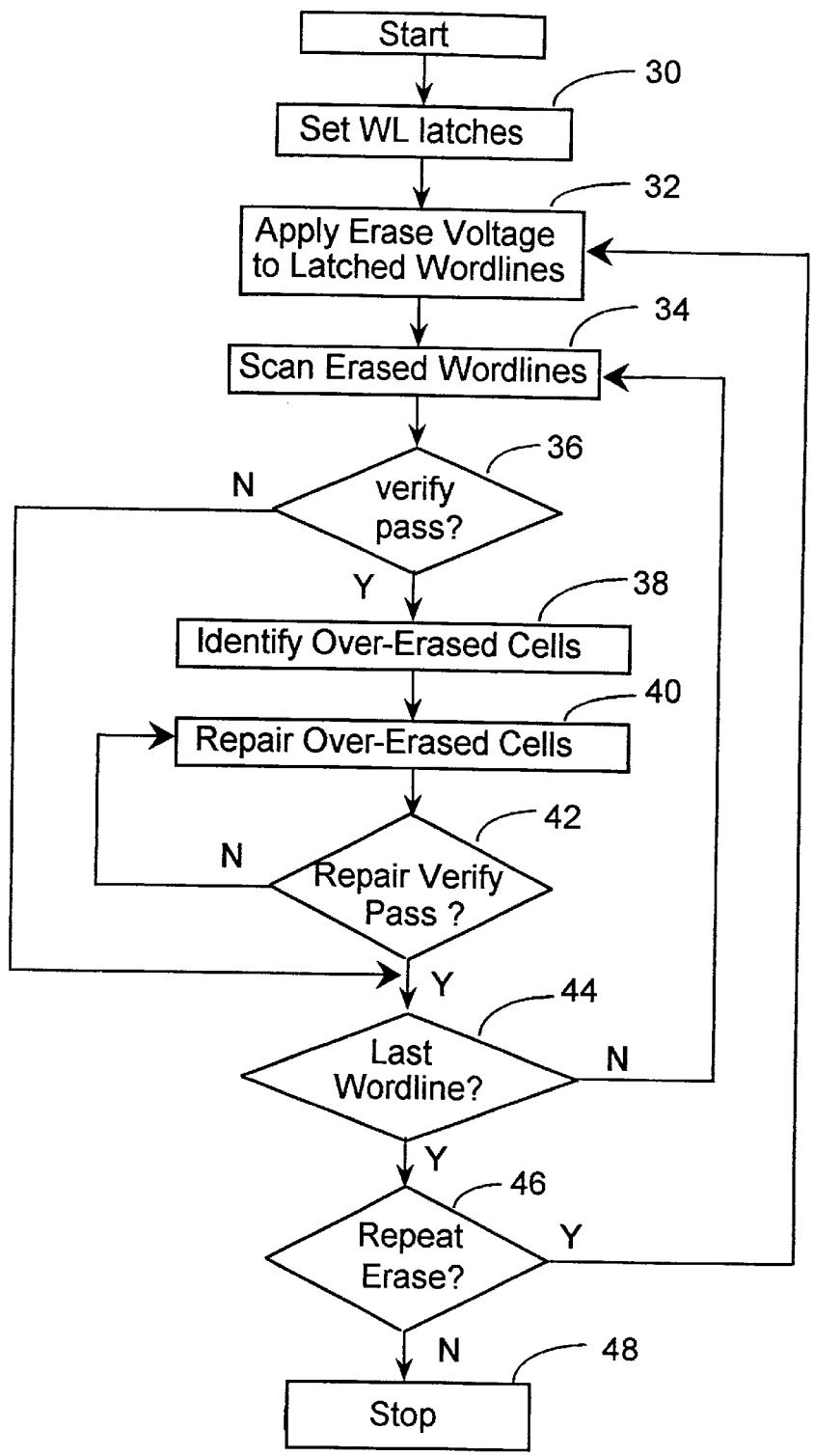
FIG. 3 is a flowchart showing operation of the flash memory of FIG. 1.

In the invention, each erased wordline is verified and repaired individually in the FIG. 3 flowchart steps 36 to 42. When a wordline passes the erase-verify and over-erase-verify, the wordline latch is reset to unerased-state. In the next erase pulse, the wordline will not be erased. Therefore, the possibility to over-erased cells is highly reduced.

REPAIRING CAN BE STOPPED FOR INDIVIDUAL CELL

Because each cell on the selected wordline can be set to repair/inhibit by the state stored in bit line latches, the repairing can be stopped for individual over-erased cell. An over-erased cell passing the repair-verification will be inhibited by reset the bit line latch from high to low. None of the over-erased cell will be over-repaired once it pass the repair verification. Therefore, the over-repair problem of the known techniques (U.S. Pat. No. 5,237,535) can be overcame.

The over-repair problem is significant. Because none of the known techniques can complete-correctly identify the over-erased cells from other cells, the other non-over-erased cells may be repaired and become programmed cells.

The over-repair problem causes two results. The first, the Vt tolerance of the erase-state should be high, otherwise, the over-erased cells may easily go into program-state. However, that is antipathetic to low VCC application and multi-level cells. The second, the repair voltage should be low. However, low repair voltage severely reduces the repair efficiency. A detailed explanation about this point is given below under the heading HIGHER REPAIR VOLTAGE.

HIGHER REPAIR VOLTAGE, HIGHER REPAIR EFFICIENCY

In the invention, because each over-erased cell can be selectively repaired, and selectively inhibited when passing repair-verify. The repair voltage can be higher than all the known techniques to achieve higher repair efficiency, without fearing over-repairing.

Due to the over-repair problem, the repair voltage of all the known techniques are low. As mentioned in some known techniques (U.S. Pat. No. 5,237,535), the repair voltage should be lower than a limited voltage (e.g. 7V), or the over-repair problem will dominate. In fact, the known technique has repair-verification, like the invention, so the repair voltage can be relatively higher.

Another known technique (U.S. Pat. No. 5,335,198) uses much lower voltage (e.g. 0V) in repairing. It is hopeful that the over-repaired cells will converge at a low Vt. The repairing time is quite long. It takes one second to repair an over-erased cell's Vt from −4V to about 1V. Besides, the converge scheme is not reliable. If a cell fails to converge to that voltage (frequently due to process-variations), the cell may converge to a lower or higher Vt, and not reach the desired Vt forever. This situation leads to wide Vt dispersion, again, and the lowest Vt may be still over-erased while the highest Vt is up to program-state.

As a result, compared with all the known techniques, the invention provides an optimal solution for the over-repair problem, and speeds up the repairing as well. Note that, although the exemplary embodiments use 5V in repairing, a person skilled in the art will recognize that the voltage is variable and dependent on the technology.

NO RELOADING ADDRESS FOR REERASE OR REPROGRAM

Once the wordlines are selected (for either erasing or programming), none of the wordline address needs to be reload. Because each wordline has a latch, the selected wordline will latch the state, until the wordline passes verification and the state is flipped. Therefore, after verifications, re-erasing or re-programming can be performed immediately without reloading the address by an off-chip controller or from on-chip registers.

In the known technique, because none of them can latch the selected address after the wordline by wordline verification, the address should be reload all the times.

NO PRE-PROGRAMMING

In most known flash memories, the pre-programming is necessary. Due to the over-erased cells not shut off when repairing, they conduct large current and increase the difficulty of repairing. Therefore, the known techniques should try to reduce the number of possible over-erased cells by pre-programming. Otherwise, the repairing may fail. In the invention, because all the over-erased cells can be shut off and repaired, more over-erased cells do not hurt the repairing. Thus, the pre-programming can be eliminated. The long programming time and power consumption are reduced.

However, this feature is an option dependent on the technology. It is well-known that, for semiconductor producers whose process-variation is larger, erasing the cells from different initial Vt may lead the initially erased-state cells to a severely over-erased Vt. For those producers, the pre-programming is recommended.

ADJUSTABLE ERASING PULSE WIDTH

Adjustable erasing pulse width is suggested by the invention. At the first several erasing pulses, the width can be longer to achieve faster erase, then the pulse width is reduced to perform small-iteration erase-verifications. The small-iterations can reduce the number of over-erased cells and still guarantee that all the cells are erased successfully. Therefore, both the writing time and final Vt distribution are minimized. This configuration gains the largest profit from the unique operations of the invention.

The known techniques can not allow too many over-erased cells exist, otherwise the repair efficiency will be low. Therefore, the erasing can not too deep. On the other hand, the known techniques based on convergence do not have erase-verification, thus the erasing should be deep to guarantee all the cells erased. The erasing pulse width then is negotiated by the two contrary conditions and hard to optimize.

ADDITIONAL EMBODIMENTS

While two basic embodiments A and B are presented above, seven more embodiments are presented, including two basic embodiments (C, D), three advanced embodiments (E, F, G) and two further advanced embodiments (H, I). Where the embodiment G is the most preferable one. The basic concept of the invention, a novel multi-voltage latch, is reviewed in the first paragraph, and then the embodiments induced from this concept are described in the following paragraphs. While the description concentrates on the erasing operation, the programming operation is performed in the same manner as the embodiments presented above.

MULTI-VOLTAGE LATCH

The concept of wordline latches is described in U.S. patent application Ser. No. 08/645,630 assigned to Aplus Integrated Circuits. The implementation brings a great benefit that the erasing size of a flash memory array can be highly flexible that multiple-wordline or multiple-block can be selectively erased simultaneously.

In this invention, the wordline latch is modified to bring more benefits. The modified latch can supply more than two output voltages. This is advantageous because the over-erase issue can be solved by applying three voltages to the wordlines when verification.

Figure 8A:
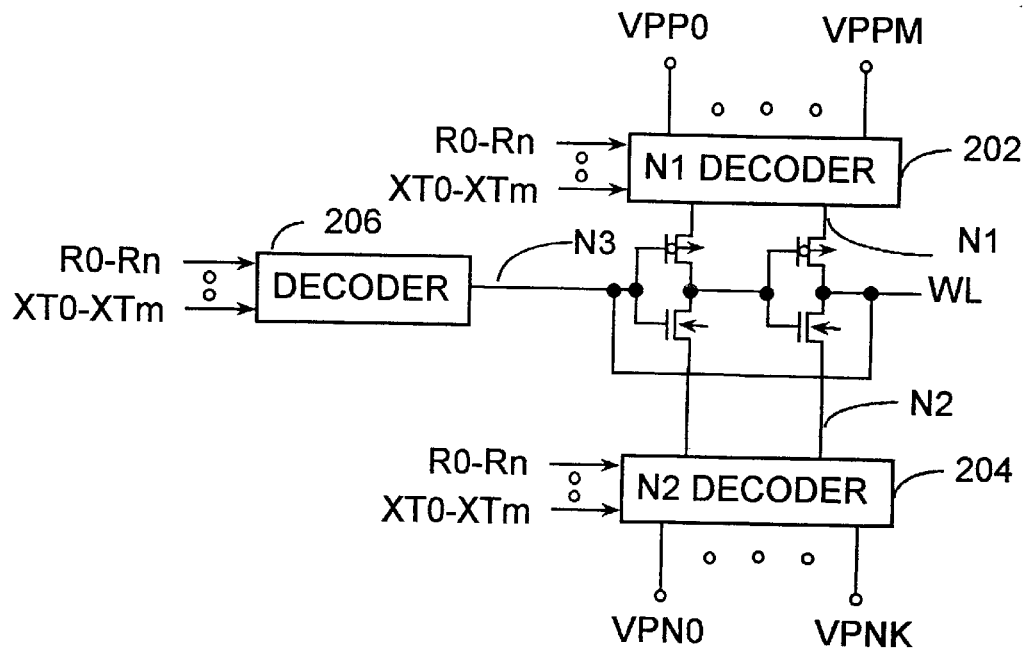
FIGS. 8A–B depict internal components of the wordline decoder circuit of FIG. 1.
Figure 8B:
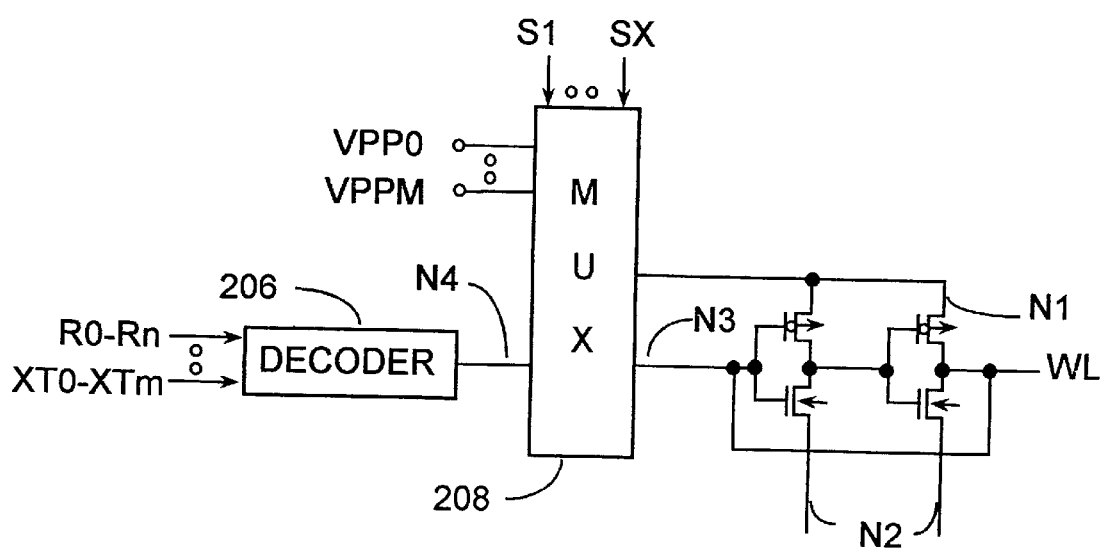

Referring to FIG. 8A, a novel multi-voltage latch is shown. A conventional latch (not shown) can supply only two voltages from sources N1, N2 in accordance with the latched data because N1, N2 of a plurality of latches are generally connected together. However, in this invention, N1, N2 are coupled to a plurality of voltage sources under the control of N1 decoder 202 and N2 decoder 204. The N1, N2 decoders are controlled by address R0–RN. Therefore, N1 and N2 can be applied with many various voltages to different wordlines. However, a person skilled in the arts will understand that N1, N2 decoders should be fit into the wordline pitch. To minimize the circuit size of N1, N2 decoders, referring to FIG. 8B, the circuit is simplified that the decoder 206 is shared with N1 decoder and N2 decoder is eliminated. The multiplexer 208 is used to select the source N1 or the input N3 of the latch to connect to the decoder.

Figure 9A:
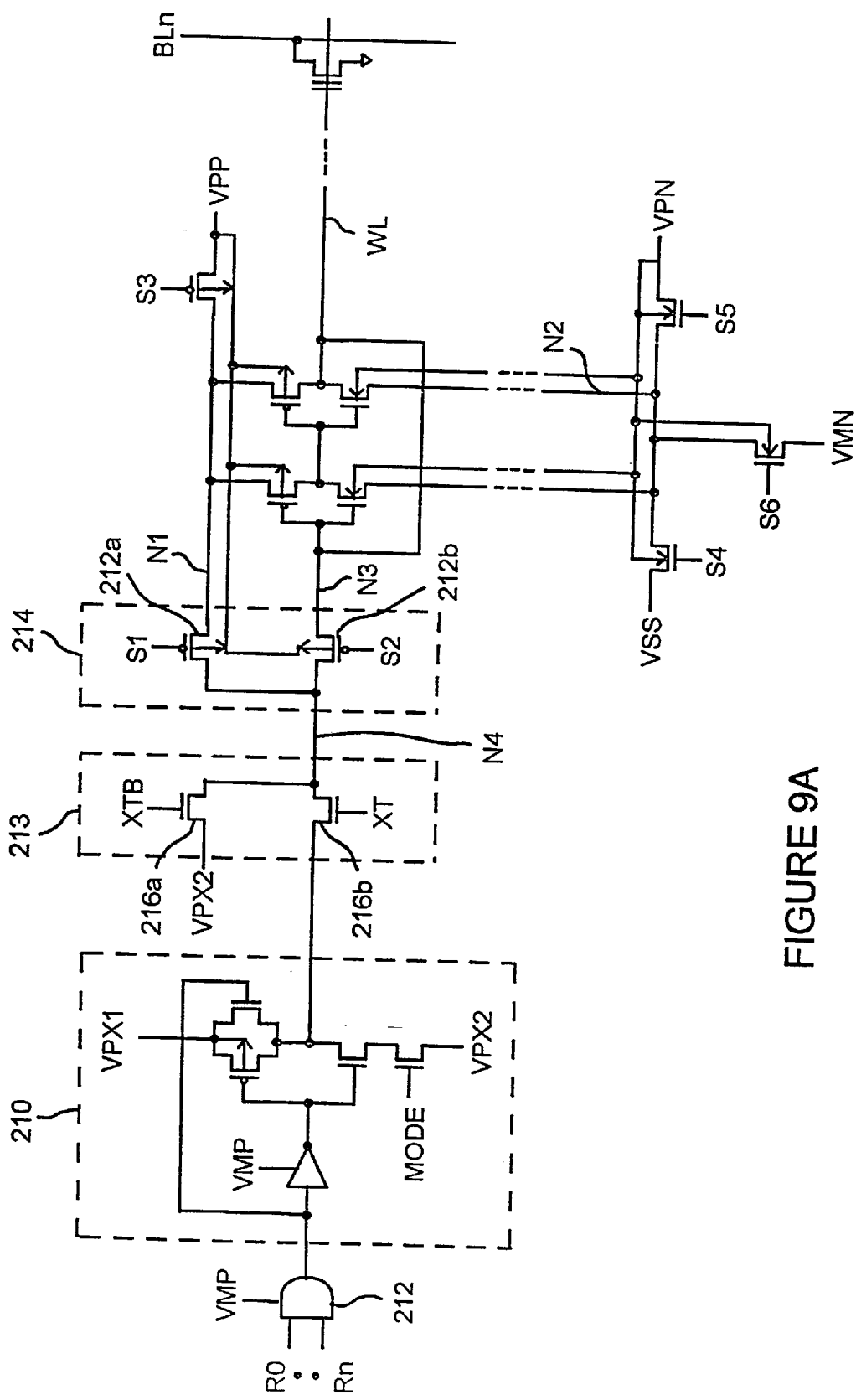
FIG. 9A depicts internal components of the wordline decoder circuit of FIG. 1.

FIG. 9A shows an exemplary implementation for the latch. The R- predecoder 212 and the XT- predecoder 213 decode VPX1 (for selected word line) and VPX2 (unselected word lines) to be applied to N4. MUX1 210 is for single or multiple selections as mentioned in the parent patent applications. MUX2 214 selects either the input (N3), the high voltage source (N1), or none of them to be coupled to the output of the decoder (N4). A complete erasing cycle contains the following steps: (1) multiple-selecting, (2) erasing, (3) scanning, (4) (three-voltage) erase-verify, (5) (three-voltage) over-erase-verify, and (6) (three-voltage) repairing. A detailed explanation for the operations of the latch in each step is described below.

When selecting the erase wordlines (loading the erase pattern), transistors 212a, 212b and 212c are off, on, on, thus N1 is coupled to VPP (VDD in this step) and N3 is coupled to the decoder. Therefore, the latch can be set and reset by the decoder. Before the erased addresses are presented, all the wordline latches are initialized to a high state by turning all the XTB pass gates 216b on and passing VPX2 (VDD in this step) to the latches to inhibit erasing. Then, MUX1 is set to multiple-select mode by turning transistor 216 off, and the erased wordline or erased block addresses are presented sequentially. The selected wordline will reset the latch to a low state by passing VPX1 (0V in this step) to the latches to affirm erasing.

When erasing the selected wordlines, transistors 212a, 212b and 212c are off, off, on, thus N1 is coupled to VPP (0V in this step) and N1 is isolated from the decoder to keep the stored state of the latch. Therefore, the latch supply the wordline voltages according to the stored erased pattern. Those latches latching a high state will apply 0V to wordlines to inhibit erasing, and those latches storing a low state will apply VPN (–HV in this step) to wordlines to erase the cells.

When scanning the erased wordlines, transistors 212a, 212b and 212c are off, on, on, thus N1 is coupled to VPP (VDD in this step) and N3 is coupled to the decoder to read the stored state from the latch. MUX1 is set to multiple-select mode and a sequencer (not shown) starts to send the wordline address from the first one to the last one. The selected wordline will pass its latched data to VPX1 and the data is checked by a comparator. If the data is low, that indicates the wordline is an erased and the following verifications and repairing steps are performed. If the data is high, that indicates the wordline is unerased and the sequencer continues sending the next address.

When verifying, the latch supplies three wordline voltages to overcome the over-erase issue. This is the most significant feature of the invention. The three voltages for (selected, unselected, unerased) wordlines are (verify voltage, –LV, 0V), respectively. The reason of applying the three voltages are described in the first preliminary draft. Before applying the three voltages, the selected wordline latch has to be reset to a high state. Thus, the (selected, unselected, unerased) wordline latches store (high, low, high) states, respectively. The unselected wordlines are applied with N2 (–LV in this step) while the selected and unerased wordlines are applied with N1. N1 is decoded by the decoder so that N1 of the selected wordline is coupled to VPX1 (the verify voltage in this step) and that of the other wordlines (including both the unerased and unselected wordlines) is coupled to VPX2 (0V in this step). Therefore, the three voltages are applied to the wordlines as desired.

Note that there is no need to re-setup for resetting the latch to a high state because, when scanning, the selected latch has been accessed by VPX1 to read the latched data, if the data is at low state, which indicates the wordline is an erased wordline, the latch can be reset to a high state by VPX1 (VDD in this step) directly.

After the selected latch is reset, transistors 212a, 212b and 212c are off, off, on and MUX1 is changed to single-select mode. Then, transistors 212a, 212b and 212c are on, off, on to couple N1 to the decoder and to isolate N3 from the decoder. The three voltages can be applied to the wordlines as desired. TABLE 2 shows the summary of the operation conditions of the latch and the wordline.

There are three verifications in a complete erasing cycle. They are: (1) erase-verify (in short, E.verify), (2) over-erase-verify (in short, O.E.verify), and (3) repair verify (in short, R.verify). The operations of the three verification are the same except the verify voltages are different.

After the cells are verified, if the latch needs to be set or reset in accordance with the verify result, transistors 212a, 212b and 212c are off, on, on, thus N1 is coupled to VPP (VDD in this step) and N3 is coupled to the decoder again. Then, MUX1 is set to multiple-select mode and the decoder can set and reset the latch to high or low states from VPX1. Generally, if the wordline passes the verification, the latch is reset to a high state to inhibit further erasing of the wordline. If the wordline does not pass the verification, the latch is reset to a low state to affirm erasing in the next erasing cycle. However, there are several different operation flows to perform this step. A detailed explanation will be given in the following paragraphs of each embodiment.

TABLE 2

|  | latch data | voltage source | wordline |
| --- | --- | --- | --- |
| erased & selected | H | N1 | VPX1 (verify voltage) |
| erased & unselected | L | N2 | VPN (-LV) |
| unerased & unselected | H | N1 | VPX2 (0V) |

When repairing the over-erased cells, the operation of the circuit is as the same as the verification, except the VPX1 is applied with the repair voltage instead of verify voltages.

By utilizing the basic circuit described above, six embodiments are created. A detailed explanation for the six embodiments are given below.

EMBODIMENT C

Figure 9B:
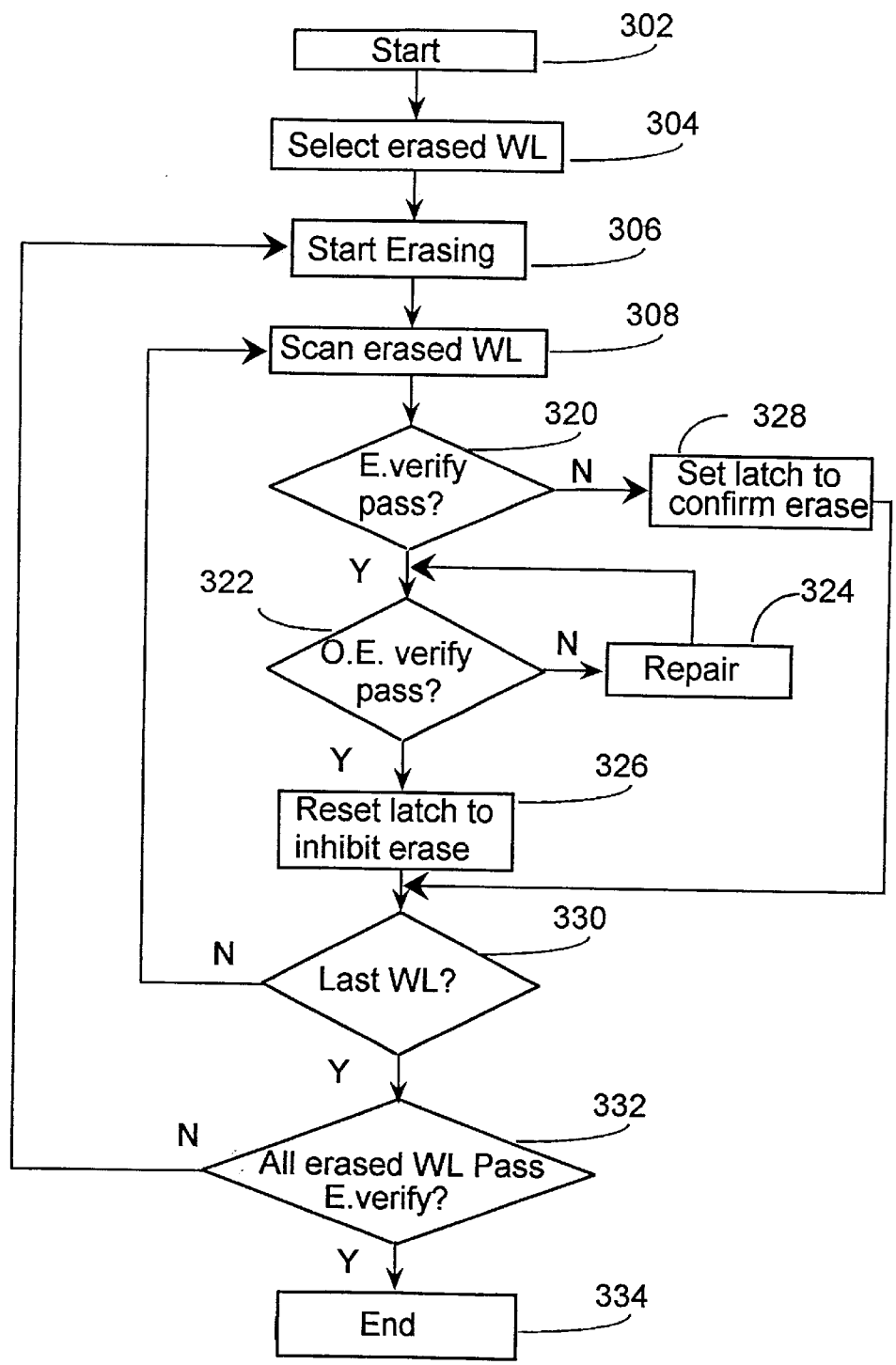
FIG. 9B is a flowchart showing the operation of a wordline decoder.

This embodiment is the basic implementation of the invention described above. The circuit diagram and the flow chart are shown in FIGS. 9A and 9B, respectively. Referring to FIG. 9B, when a wordline passes E.verify (step 320), O.E verify and repairing (step 322 and step 324) are performed repeatedly until the wordline passes O.E.verify. Only when the wordline passes both E.verify and O.E.verify, the latch is reset to high state to inhibit further erasing of this wordline and the sequencer starts to scan the next erased wordline. If the wordline does not pass E.verify, the latch is set to low state to affirm erasing this wordline in the next erasing cycle and the sequencer starts to scan the next wordline.

This embodiment requires deep-erasing the cells in the first erasing cycle to bring most of the cells' Vt below the E-verify voltage because, when repairing the selected wordline, if there are cells in the unselected wordlines not passing E.verify, stress (due to the bit line voltage required for repairing) of cells may be high.

Figure 9C:
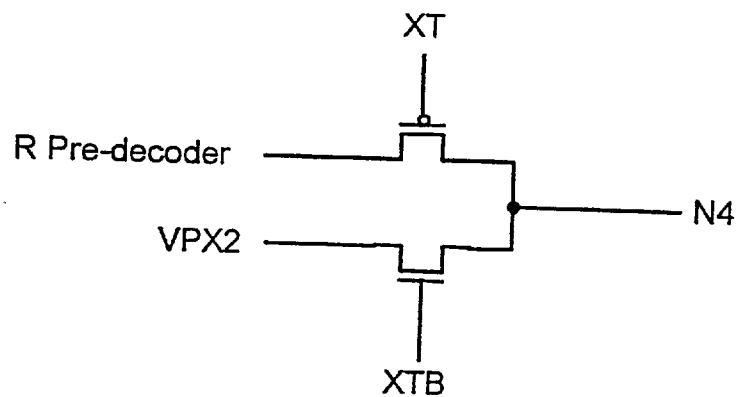
FIGS. 9C–D depict XT-predecoders according to an embodiment of the invention.
Figure 9D:
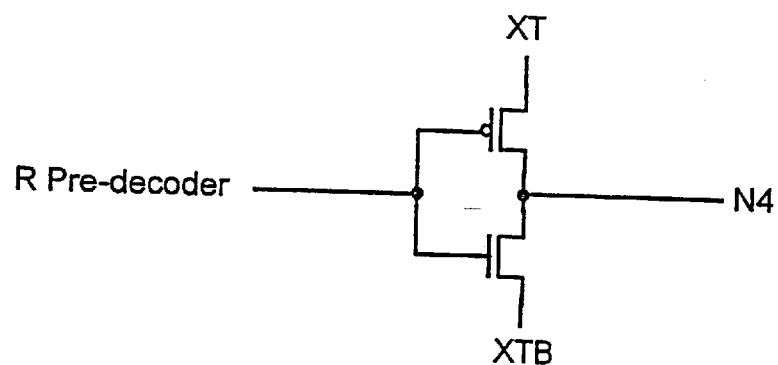

FIGS. 9C and 9D show another two implementations of the XT pre-decoder 213. The control signals of the pass gates can be boot-strapped for increasing the read speed.

EMBODIMENT D

Figure 10:
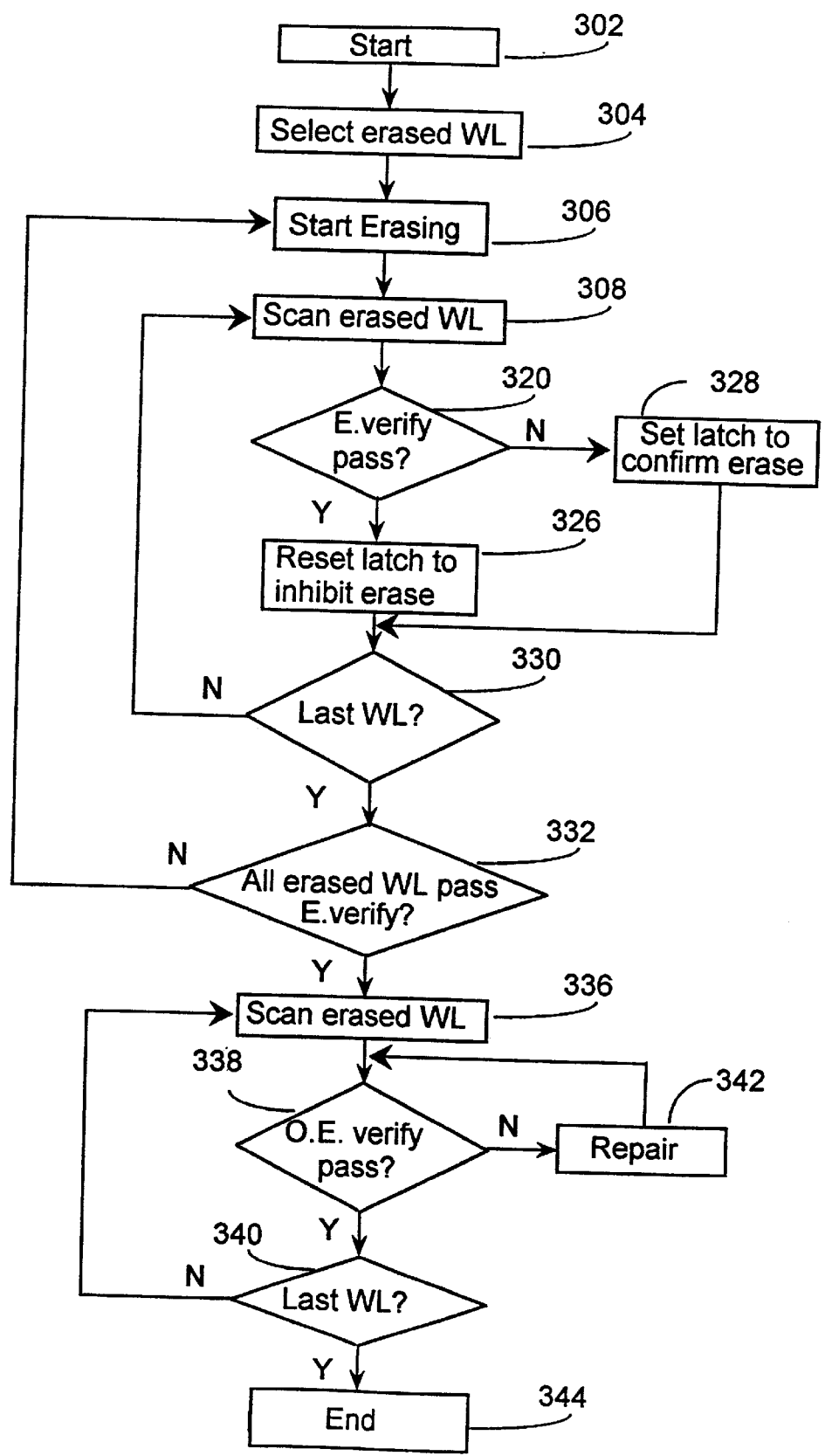
FIG. 10 is a flowchart showing the operation of a wordline decoder.

This embodiment has the same circuit but different flow chart from the embodiment C. The circuit diagram and the flow chart are shown in FIGS. 9A and 10, respectively. Different from the embodiment C, O.E verify and repairing are performed after all the erased wordlines pass E.verify. Referring to FIG. 10, if an erased wordline passes the E.verify (step 320), the latch is reset to high state, otherwise, the latch is set to low state. After the latch is set or reset, the sequencer starts to scan the next erased wordline. If any wordline does not pass E.verify, the erasing and E.verify are repeated.

After all the erased wordlines pass E.verify, which is indicated by that all the latches are reset to a high state, the sequencer starts to scan the over-erased wordlines for repairing. To do that, MUX1 is set to single-select mode and the decoder starts to present the wordline addresses from the first one to the last one. The selected wordline is applied with VPX1 (O.E.verify voltage in this step) to verify the cells and the other wordlines are applied with VPX2 (−LV in this step) to shut off the possible over-erased cells. When an over-erased cell is sensed, O.E.verify and repairing are performed repeatedly. The advantage of this embodiment is that the O.E.verify and repairing performed only after all the erased cells pass E.verify, thus none of the cells which do not pass E.verify is exposed under the repair bit line voltage. As a result, the deep-erasing required by the embodiment C is not necessary and the stress is minimized.

EMBODIMENT E

Figure 11:
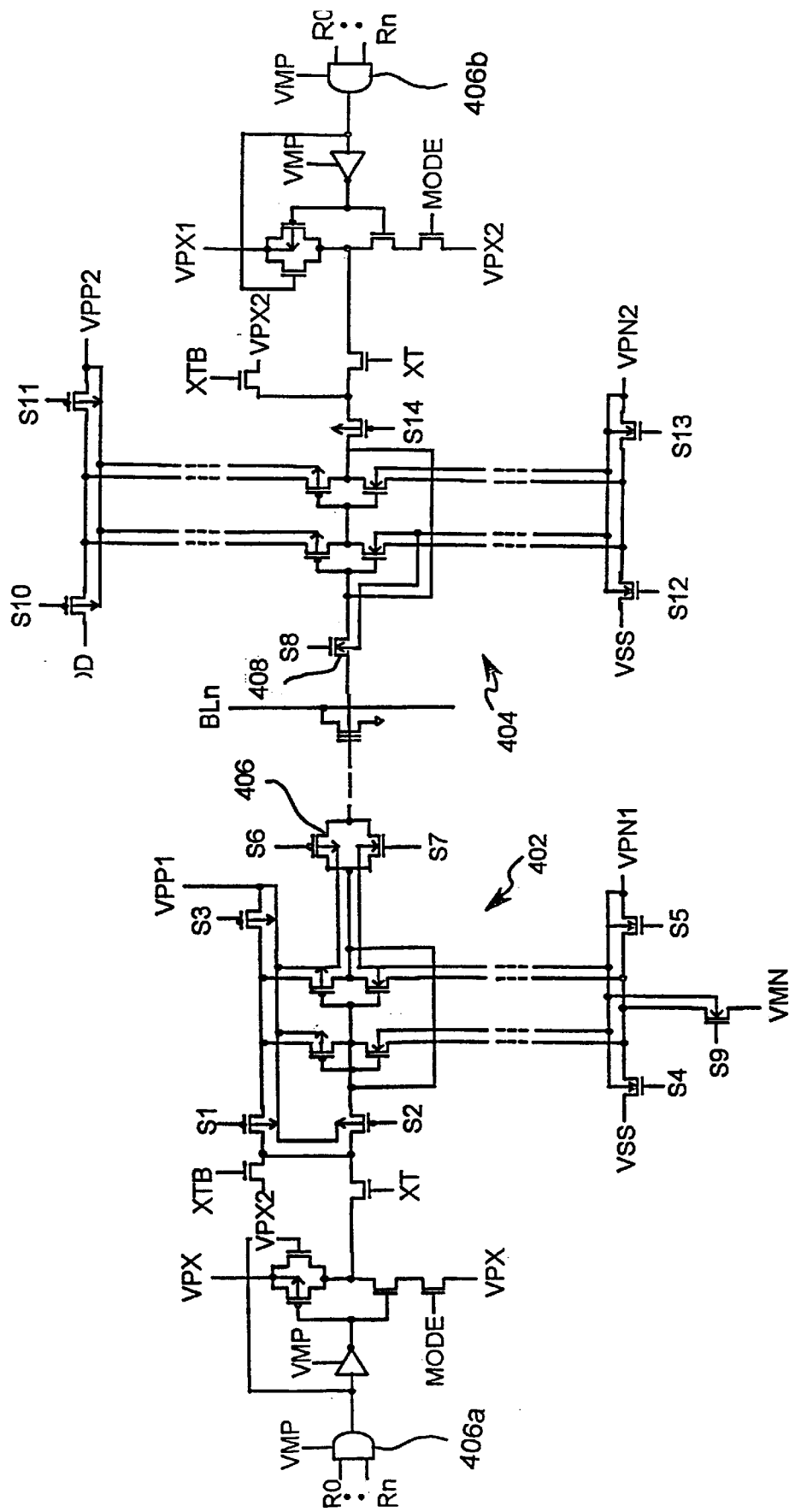
FIG. 11 depicts internal components of the wordline decoder circuit of FIG. 1.

This embodiment has the same flow chart but different circuit from the embodiment C. The circuit diagram and the flow chart are shown in FIGS. 11 and 10, respectively. Different from the embodiment C, this embodiment comprises a master latch 402 and a slave latch 404. Each latch has an individual decoder (decoder 406a decodes the master latch and decoder 406b decodes the slave latch), thus the master and the slave latches can be set and reset independently. The master and the slave latches initially latch the same erased wordline pattern. However, when E.verify, the wordline passes E.verify will reset its slave latch to high state, thus the slave latch stores updated erase pattern while the master latch always keeps the original erase pattern. When erasing, transistors 406 and 408 are off, on, thus the master latch is isolated from the wordlines and the slave latch determines the erase pattern. When scanning, verifying and repairing, transistors 406 and 408 are on, off, thus the master latch determines the pattern of the three-voltages applied to the wordlines. In the other words, the master latch stores the original erase pattern for scanning, verifying and repairing, and the slave latch stores the updates erase pattern for the next erasing cycle.

This is advantageous because, in scanning, verifying and repairing, only the original erased wordlines are applied with −LV to shut off possible over-erased cells while the embodiment C needs to apply all the wordlines with −LV because the embodiment C has reset all the original pattern in E.verify, thus the power consumption is reduced.

When programming, the high voltage required for the selected word line can be provided by wither VPP1 or VPP2.

EMBODIMENT F

Figure 12:
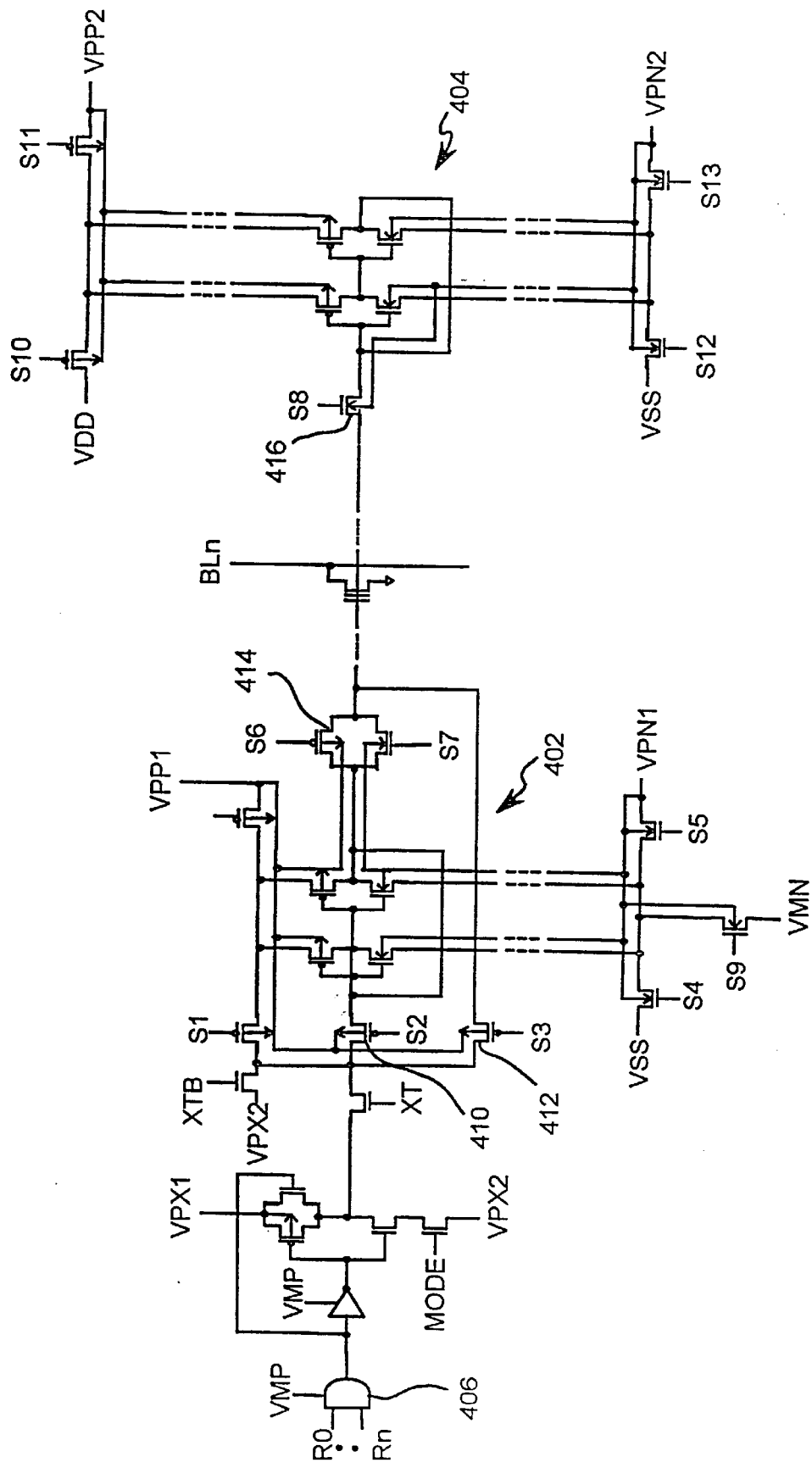
FIG. 12 depicts internal components of the wordline decoder circuit of FIG. 1.

This embodiment has the same flow chart but different circuit from the embodiment E. The circuit diagram and the flow chart are shown in FIGS. 12 and 10, respectively. This embodiment also comprises a master latch 402 and a slave latch 404. However, a single decoder 406 is shared by the master and slave latches. When set and reset the slave latch in E.verify, transistors 410, 412, 414 and 416 are off, on, off, on, thus the decoder bypasses the master latch through wire N5 to the slave latch. Other operations are the same as the embodiment E.

EMBODIMENT G

Figure 13:
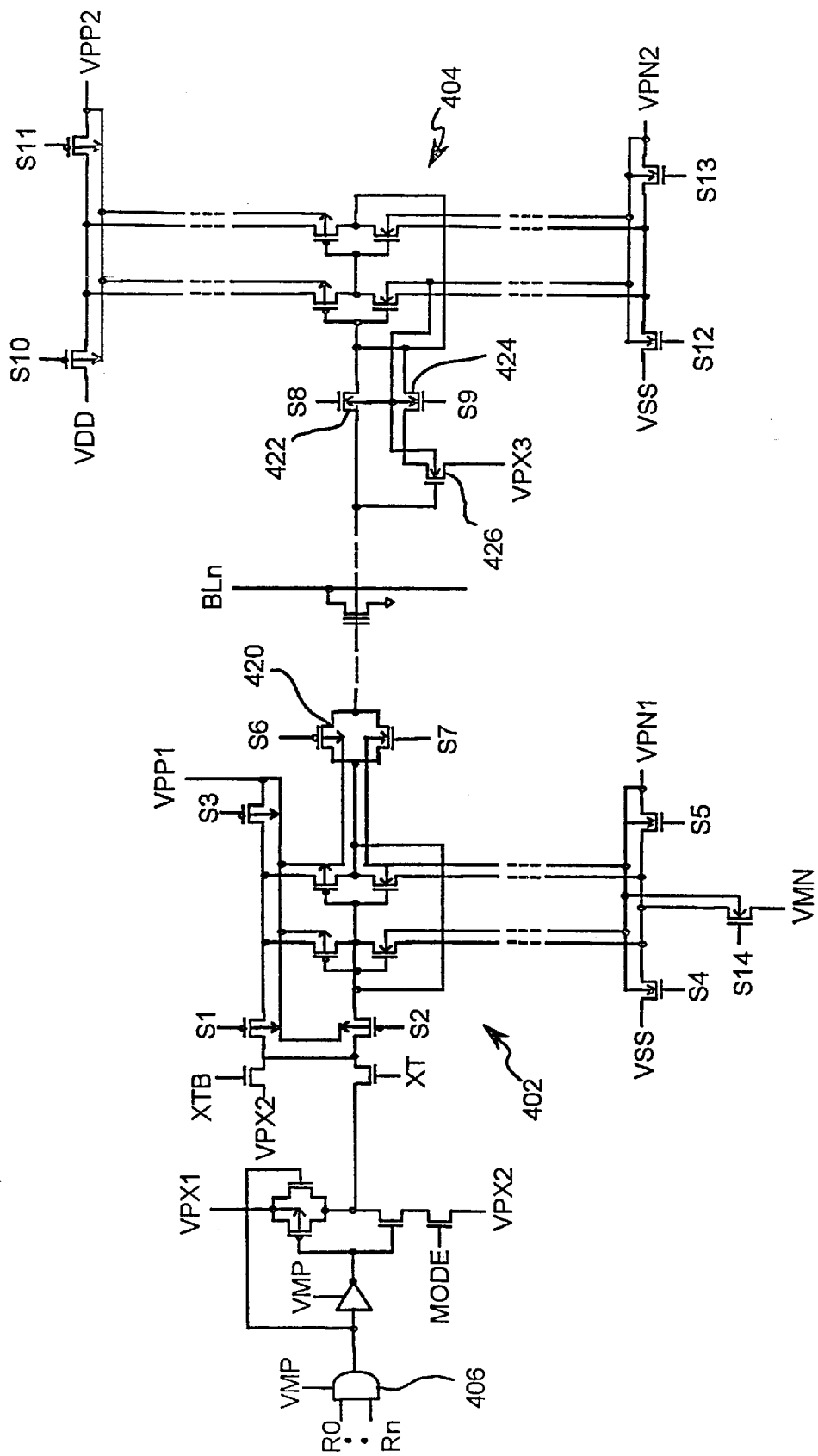
FIG. 13 depicts internal components of the wordline decoder circuit of FIG. 1.

This embodiment has the same flow chart but different circuit from the embodiment F. The circuit diagram and the flow chart are shown in FIGS. 13 and 10, respectively. This embodiment also comprises a master latch 402 a slave latch 404 and a decoder 406. However, the way to set and reset the slave latch is different to the embodiment F. When initially select the erased wordline pattern, transistors 420, 422 and 424 are on, on, off, thus both the master and slave latches latch the same pattern from the decoder. When erasing, transistors 420, 422 and 424 are off, on, off, thus the slave latch determines the erased wordline pattern. When verifying, transistors 420, 422 and 424 are on, off, off, thus the master latch determines the three-voltage verify pattern. When the wordline passes E-verify, transistors 420, 422 and 424 are on, off, on, thus the selected wordline turns transistor 426 on to pass VPX3 (VDD in this step) to reset the slave latch to high state for inhibiting further erasing, while the pattern of the other wordlines' slave latches remain unchanged. This is advantageous because the master latch needs not be bypass while the circuit has the same function as the embodiment F, thus reduces the layout complexity. This embodiment is preferable in the invention.

When programming, the high voltage required for the selected word line can be provided by wither VPP1 or VPP2.

EMBODIMENT H

Figure 14A:
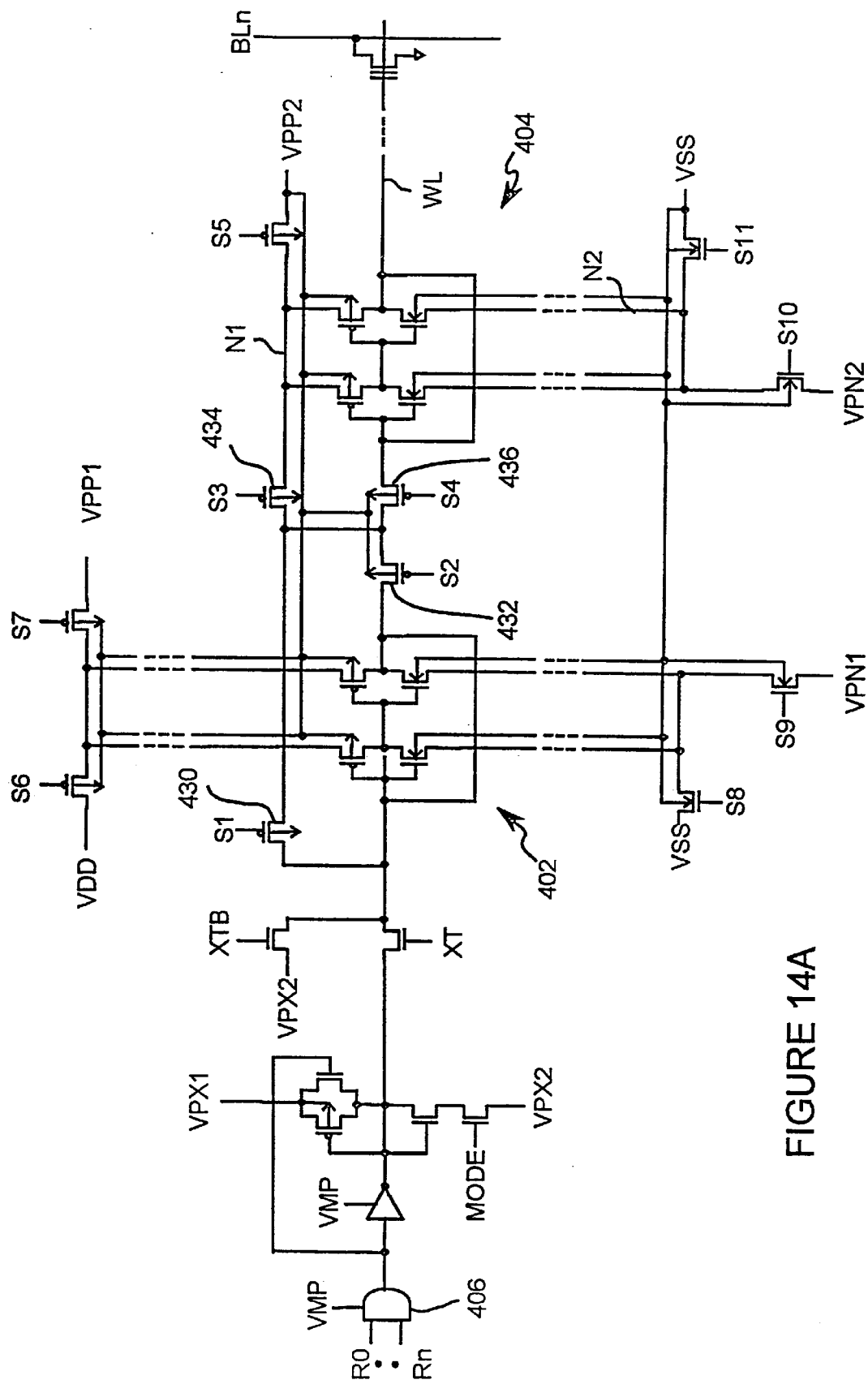
FIG. 14A depicts internal components of the wordline decoder circuit of FIG. 1.
Figure 14B:
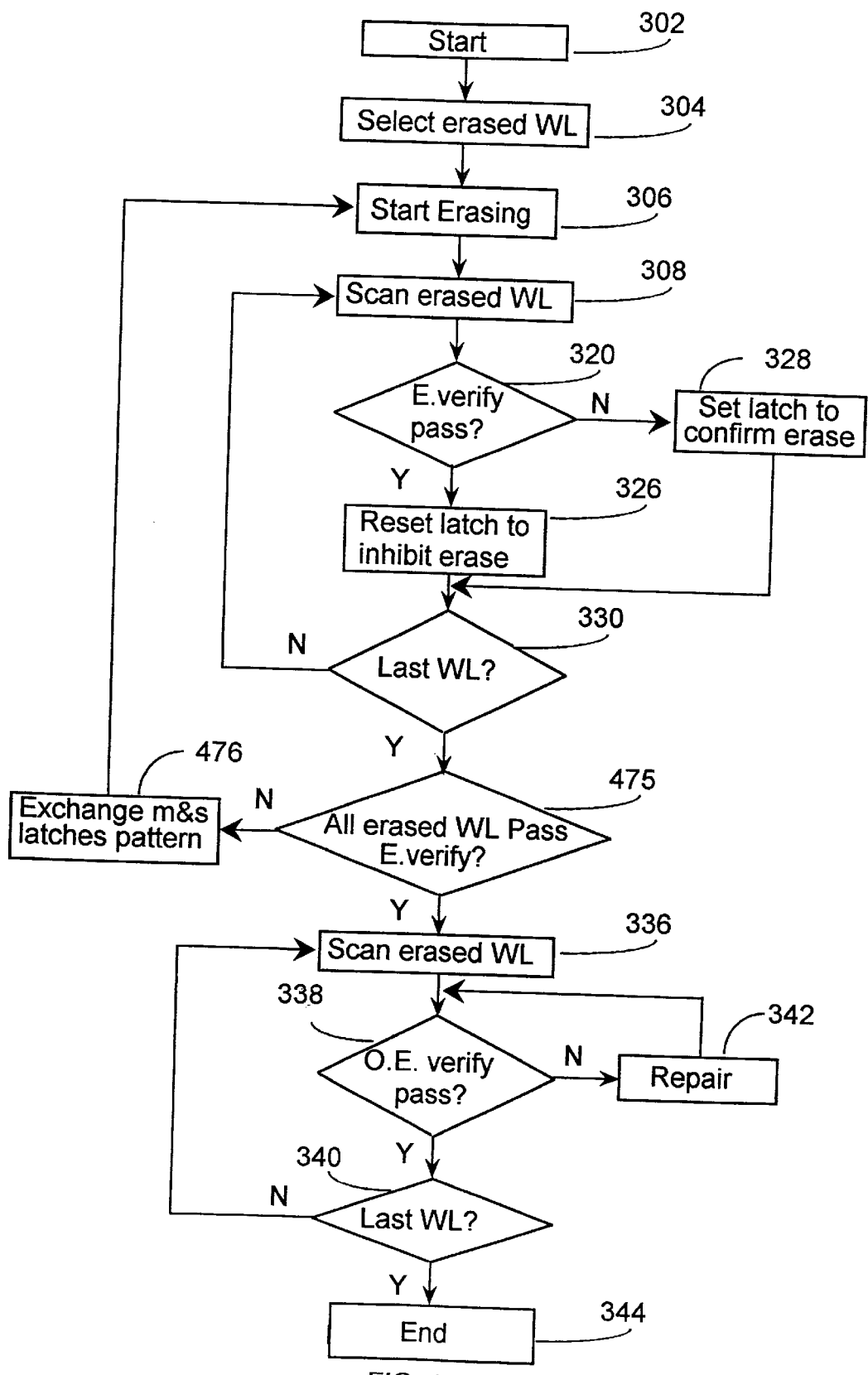
FIG. 14B is a flowchart showing the operation of a wordline decoder.
Figure 14C:
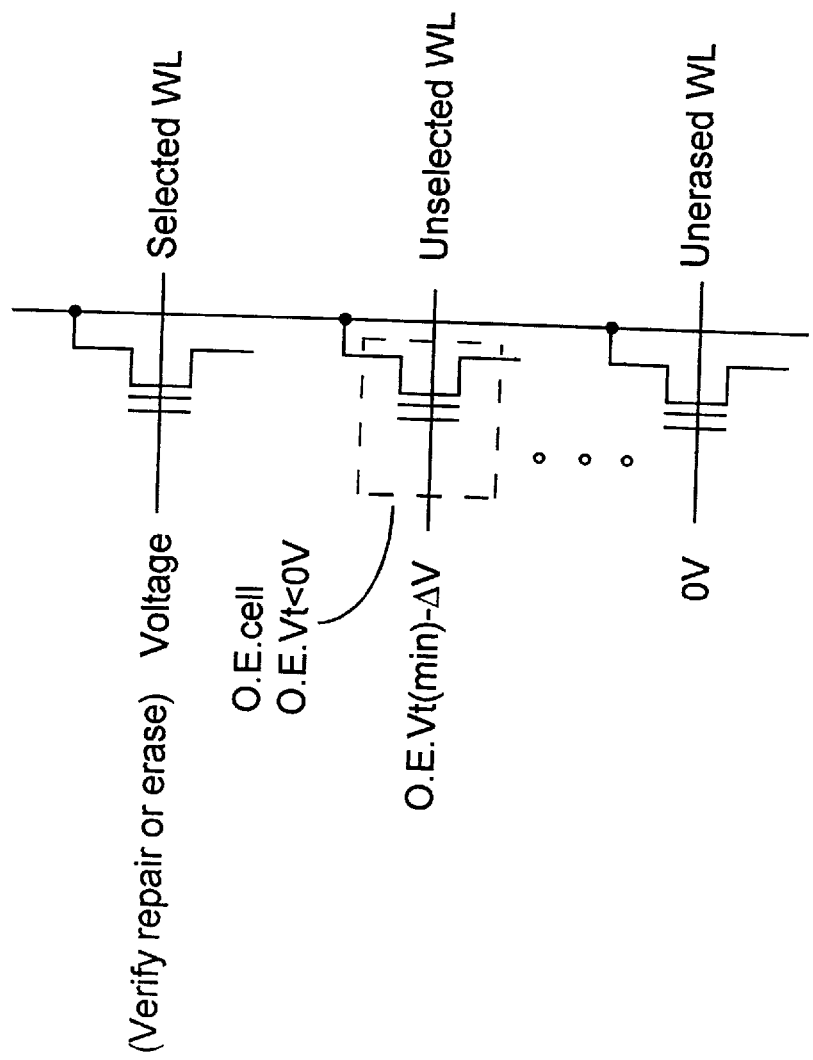
FIG. 14C is a NOR-plane array showing operational voltages applied.

This embodiment's flow chart and circuit are both different from the embodiment G. The circuit diagram and the flow chart are shown in FIGS. 14A and 14B, respectively. This embodiment also comprises a master latch 402, a slave latch 404 and a decoder 406. Different to the embodiment C–G, when erasing, the wordlines are applied with three voltages, as shown in FIG. 14C. This is advantageous that the possible over-erased cells in the erased wordlines which pass E.verify are shut off.

To do that, the latch is further modified to apply three output voltages to multiple wordlines. A limitation of the latch used in the previous embodiments is that it can supply multiple wordlines with a first voltage (e.g. −LV to unselected wordlines), multiple wordlines with a second voltage (e.g. 0V to unerased wordlines), but only one wordline with a third voltage (e.g. the verify voltage to the selected wordline). Because the second and the third voltages are supplied by N1 of the latches, which is coupled to the decoder, and the decoder performs single-selection, only one N1 can be applied with the third voltage while the others can be applied with the second voltage. Alternatively, in this embodiment, N1 of the slave latch is coupled to the master latch instead of the decoder. Because the master latches can supply multiple wordlines with two voltages, the slave latch can supply multiple wordlines with the two voltages from N1, and multiple wordlines with the third voltage from N2. TABLE 3 shows the operation conditions of the latches and the wordlines.

TABLE 3

|  | master latch | slave latch | wordline |
| --- | --- | --- | --- |
| erased | L | L | VPN2 (-HV in this step) |
| erased pass e.verify | L | H | VPN1 (-LV in this step) |
| unerased | H | H | VPP1 (0V in this step) |

The master latch stores the original erased pattern and the slave latch stores the updated pattern. When erasing, transistors 430, 432, 434 and 436 are off, on, on, off, thus N1 of the slave latch is coupled to the master latch and the three-voltage erasing described above is performed. When verifying and repairing, transistors 430, 432, 434 and 436 are on, off, on, off, thus the three-voltage verification and repairing steps similar to the embodiment G are performed. However, note that the wordline which pass the E.verify can not reset the slave latch to high state directly, because if the slave latch is reset, the wordline will be applied with 0V when the next erased wordline is scanned, verified and repaired, and possible over-erased cells in this wordline will not be shut off. Therefore, referring to FIG. 14B, an extra step 476 is added after step 475. When a wordline passes E.verify, its master latch is reset to high state instead of the slave latch, thus the wordline is still applied with -LV to shut off the possible over-erased cells. After all the wordlines are verified, step 476 is performed that all the master latches (stores the updated pattern) and the slave latches (stores the original pattern) exchange patterns. This is done by scanning all the wordlines again. When a wordline is selected, transistors 430, 432, 434 and 436 are on, off, off, on, thus the data of the slave latch is read output to VPX1 and stored in a global latch (not shown). Then, transistors 430, 432, 434 and 436 are off, on, off, on, thus the data stored in the master latch flips the slave latch, and then transistors 430, 432, 434 and 436 are on, off, off, on and the slave latch data stored in VPX1 is loaded to the master latch.

EMBODIMENT I

Figure 15:
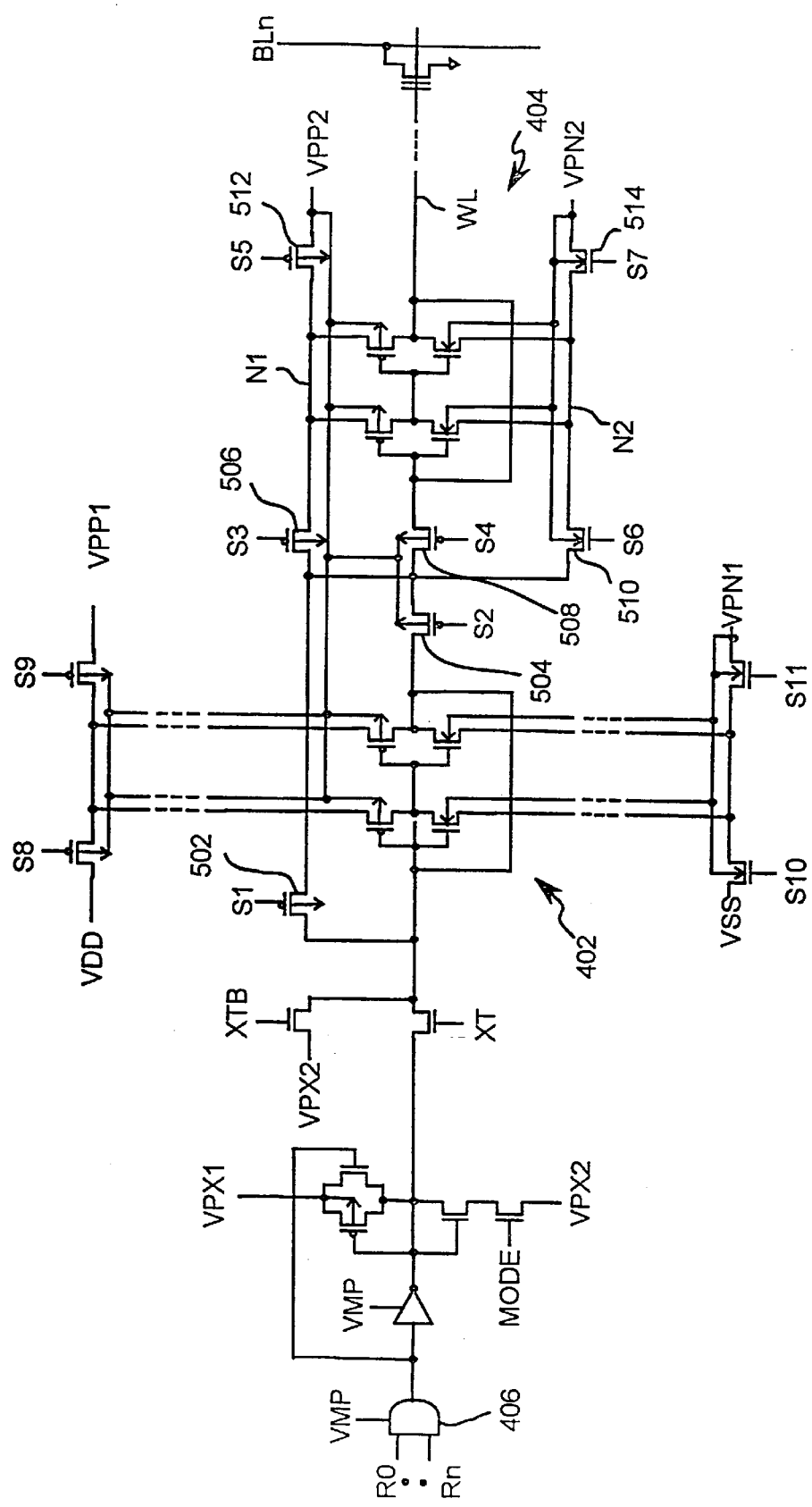
FIG. 15 depicts internal components of the wordline decoder circuit of FIG. 1.

This embodiment has the same flow chart but different circuit from the embodiment G. The circuit diagram and the flow chart are shown in FIGS. 15 and 10, respectively. This embodiment also comprises a master latch 402, a slave latch 404 and a decoder 406. When erasing, the wordlines are also applied with three voltages. However, transistors 502, 504, 506, 508, 510, 512 and 514 are off, on, off, off, on, on, off to couple N2 to the master latch and N1 to VPP2 (0V in this step), thus the second and the third voltages are supplied from N2 instead of N1 by the master latch. With this modification, when erasing, the master latch can still store the updated pattern and the slave latch can still store the original pattern without exchanging their patterns like the embodiment H. This is advantageous because no pattern exchange is needed. TABLE 4 shows the operation conditions of the latches and the wordline.

TABLE 4

|  | master latch | slave latch | wordline |
| --- | --- | --- | --- |
| erased | L | L | VPN1 (-HV in this step) |
| erased pass e.verify | H | L | VPP1 (-LV in this step) |
| unerased | H | H | VPP2 (0V in this step) |

When scanning, transistors 502, 504, 506, 508, 510, 512 and 514 are on, off, off, on, off, on, on to couple N1 to VPP2 (VDD in this step) and N2 to VPN2 (0V in this step). Thus, the selected wordline's latched data can be read from VPX1.

When verifying and repairing, transistors 502, 504, 506, 508, 510, 512 and 514 are on, off, on, off, off, off, on to couple N1 to the decoder and N2 to VPN2 (-LV in this step), thus the selected wordline is applied with VPX1 (the verify of repair voltages) and the unselected wordlines are applied with VPX2 (0V in this step).

CONCLUSIONS

Nine embodiments have been introduced in this draft. Where the embodiment G is the most preferable. Because these embodiments all induced from the same concept of a multi-voltage latch, the most important thing for the patent application for this invention is to cover the basic concept in the claim instead of covering all the circuits. Thus, any modification of the circuit which still uses multi-voltage (more than two) latch or multi-voltage (more than two) wordlines in any of erasing, verification, or repairing steps is be covered by this patent.

FAST HIERARCHY SCANNING

One new scan scheme is added to improve the step of "SCAN ERASED WL" shown in FIG. 9B. By using the new scheme, the scanning time is reduced. As mentioned in the previous preliminary drafts, the purpose of the scan procedure is to find each erased wordline embedded. After an erased wordline is found, E.verify, O.E.verify and repairing can be performed to that wordline. The approach introduced in the previous preliminary draft scans all the wordlines to find the erased wordline. All the wordline addresses are applied sequentially to the decoder to read the data of each wordline latch out from VPX1. Thus, the previously selected erased wordlines can be found embedded without reloading the addresses. However, the scanning time is long because every wordline has to be scanned.

Figure 16:
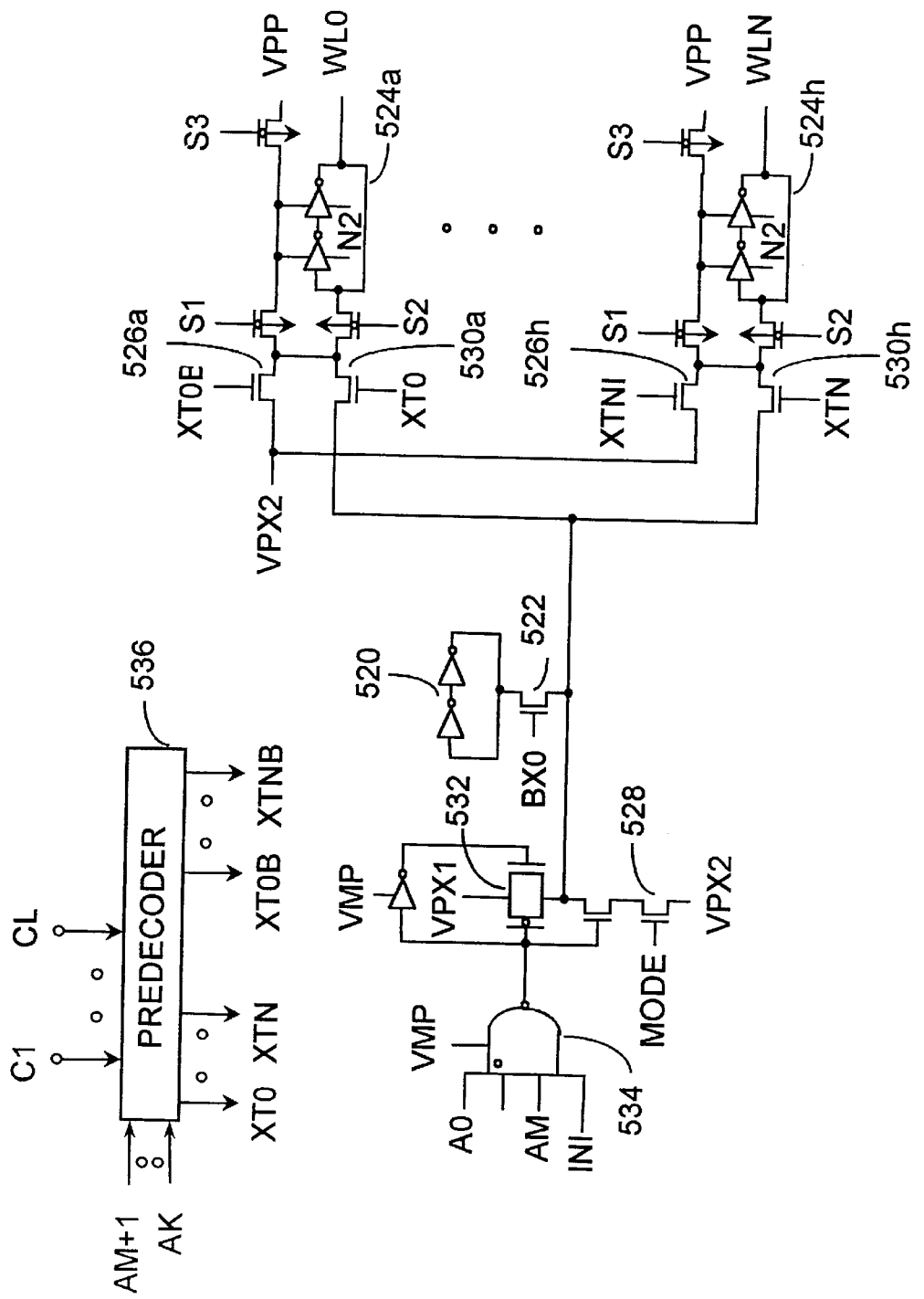
FIG. 16 depicts internal components of the wordline decoder circuit of FIG. 1.
Figure 17:
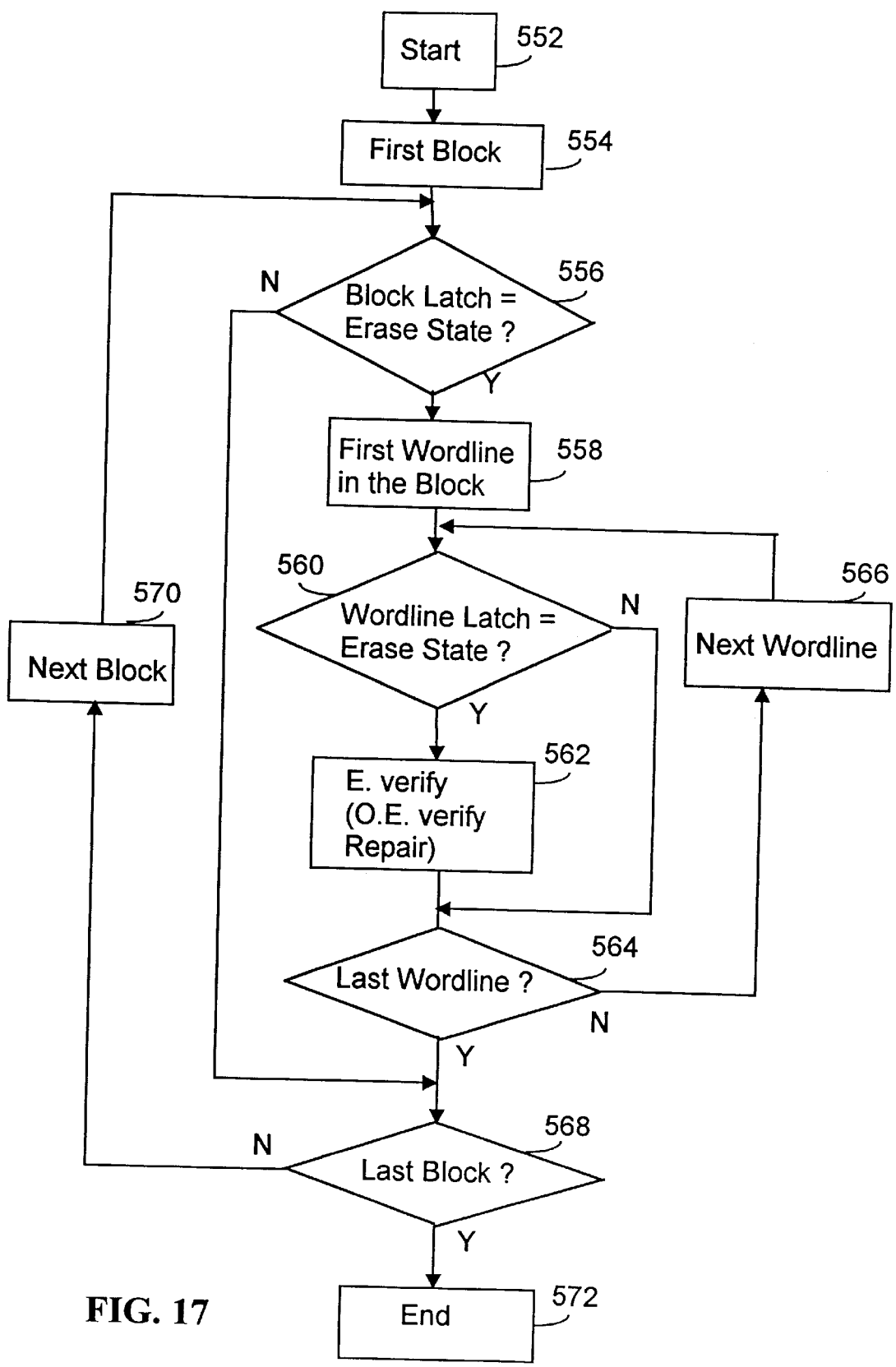
FIG. 17 is a flowchart showing the operation of a wordline decoder.

Alternately, the new approach uses a hierarchy scheme to reduce the scanning time. Referring to FIG. 9A the wordline decoders are previously built in a hierarchy structure that the predecoder decodes one block out of several blocks and each block contains several wordlines. Each block has a block latch and the block latch is scanned rather than the wordline latches. Referring to the attached FIG. 16, a block latch 520 and transistor 522 are added to the wordline decoder circuit shown in FIG. 9A. The block latch stores an information to indicate if there are any erased wordlines in the block. When scanning, the block latch is scanned first. Only when the data of the block latch shows that there is erased wordlines in the block, the wordlines in the block are scanned. Therefore, the scanning time is reduced.

The data stored in the block latch is set when the multiple wordline latches are set simultaneously. Before setting the latches, firstly, all the wordline latches 524a–h and the block latch 522 are initialized to a high state. To achieve that, transistors 526a–h and 528 are all off and 530a–h and 522 are all on. Signal INI then changes to low to turn on transistor 532 of all the blocks. Thus, block latch 520 and wordline latches 524*a–h* are all set to high by VPX1 (VDD in this step).

After the initialization, signal INI changes to high to return predecoder 534 to regular operation. Transistor 522 changes to be off to isolate block latch 520. Then, the addresses of the erased wordlines are applied to both the predecoder 534 and predecoder 536 sequentially. The selected predecoder turns on transistor 532 and the selected 530*a–h*, thus the wordline latch is reset to low by VPX1 (0V in this step). The wordline latches storing low will apply a negative high voltage to wordlines to erase cells in the next erasing cycle.

After the selected wordline latch is reset, all transistors 530*a–h* are off and transistor 522 changes to be on, thus the block latch 520 is reset to low by VPX1 to indicate there is erased wordline selected in this block. If there are multiple wordlines selected in a block, the block latch will be reset to low state each time. If there is no erased wordline in a block, the block latch will remain at initial high state.

When scanning, block latches are scanned first. Transistors 522 is on and 528, 526*a–h* and 530*a–h* are all off to isolate the wordline latches. Block addresses from the first block to the last block are applied to predecoder 534 sequentially. The selected predecoder turns on transistor 532 to read the data of the block latch 520 out from VPX1. If the data is high, which indicates there is no erased wordline in the block, the next block address is presented. If the data is low, the wordlines in the block are scanned to find the erased wordlines. To achieve that, transistor 522 is shut off to isolate the block latch and transistors 530*a–h* are turned on sequentially to read the data of all the wordline latches 524*a–h* out from VPX1. When an erased wordline is found (the data of the wordline latch is low), the following E.verify, O.E.verify and Repair procedures are performed as described above.

Using this scanning scheme, the scanning time is significantly reduced. The best case shows that the time reduced to about ⅛ if there is only one erased wordline in an array in which a block has eight wordlines. Note that the block size and the configuration of the predecoders can be altered. For example, three-level predecoder can be used. Considering a case that several wordlines can be grouped into a sub-block, and several sub-blocks can be grouped into a block, and so on, the scan procedure then is performed based on a hierarchy of blocks, sub-blocks and then wordlines. Note that the basic idea of hierarchy scanning function is claimed in this patent, thus, no matter how many levels of the hierarchy is used, such modification are still covered by this patent.

In the other embodiment shown above, the latches can also be initialized by VPX2 (VDD in this step). To achieve that, transistors 526*a–h* and 530*a–h* are on, off. For the new scanning scheme, both the methods can be used to initialize the wordline latches, too. However, the approach described in this document is preferable.

VOLTAGE AND CURRENT PUMPS

The disclosed embodiments assume that any necessary power level is supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961. The incorporation of a pump generator with the exemplary embodiments expands the operational voltages in order to facilitate improved yield and reliable retrieval of stored values.

For example, if the memory is supplied with VDD(+3.3V), and needs VPP(+10V) for a program function, the voltage pump generator creates the needed voltage and provides it to the decoder circuits to accomplish the necessary function. Likewise, the voltage pump can provide a negative voltage VPN(−10V) to the decoder circuits for the erase function.

ADVANTAGES OF THE INVENTION

The points of the invention superior to the known techniques include:

1. The invention has an erase-verify, and the erase-verify voltage can be very low without the fear of overerase because the overerased cells are shut off.
2. The erase-verify operation can keep the highest erase-state Vt limitation accurately below a very low value, thus, the invention becomes even superior for low VCC application.
3. Each selected wordline passing the erase-verify can stop erasing individually, thus the stress of the cells on the wordline can be minimized.
4. Each selected wordline passing the erase-verify can stop erasing individually, thus the number of over-erased cells can be minimized.
5. Each selected wordline passing the erase-verify can stop erasing individually, thus the erase-state Vt distribution can be tightened.
6. The invention has a repair-verify, and the lowest erase-state Vt limitation can be tightly controlled within a reasonable range below the upper Vt limitation. Thus, the erase-state Vt distribution can be very narrow.
7. The invention minimizes the current required for repairing by shutting off the over-erased cells that leak large current in all the known techniques.
8. The electronic characteristics of the cells in an array, such as Vt, etc. can be measured directly because the invention can apply very low voltage to wordlines. None of the known techniques can do that because their high voltage output for the selected wordline is driven by a PMOS transistor while the low voltage output for unselected wordlines is driven be a NMOS transistor. The PMOS transistor limits the minimum selected wordline's voltage. It can not be lower than |Vtp| (about 0.7V). Thus, any Vt or I–V curve below |Vtp| can not be measured.
9. The positive/negative high voltage well need not be discharged in the erase/erase-verify, program/program-verify, and repair/repair-verify iteration. Thus, the large power consumption used in these operations are eliminated.

CONCLUSION

The invention provides many advantages over known techniques. The invention includes the optimal overerase repairing, and the ability to verify the status of the memory. The invention reduces program time. In a typical flash memory, the entire array is erased and re-programmed, which is a time-consuming procedure. Even when a page-erase feature is provided, the entire page is erased and re-programmed, which is also time-consuming. The invention provides a fast and convenient way to erase only those bytes that need to be re-programmed. The invention reduces time and provides improves processor access to the flash memory. Additionally, the invention reduces power consumption by using power only when a byte-erase and re-program are required. This is an important advantage for portable electronics.

The invention also improves the longevity of the flash memory. Since only the bytes that require re-programming are erased, stress on the flash memory cells is reduced. As a result, the invention can provide a large number of operable program/erase cycles, such as 10^6 program/erase cycles, in a flash memory. Finally, flash memories incorporating the invention can be constructed using any size array such as a 16×32, 1K×1K, 1K×2K, or N×M array.

Having disclosed exemplary embodiments and the best mode, modifications and variations may be made to the disclosed embodiments while remaining within the scope of the invention as defined by the following claims.

What is claimed is:

1. A flash memory wordline decoder with overerase protection comprising:
   a plurality of voltage terminals to receive a plurality of voltages;
   a plurality of address terminals to receive a plurality of address signals;
   a procedure terminal to receive a procedure signal;
   a plurality of output wordlines adapted to be coupled to a bank of flash transistors; and
   a decoder circuit coupled to said voltage terminals, said address terminals and said procedure terminal and configured to decode said address signals, said decoder circuit including a plurality of latches coupled to said wordlines and configured to selectively latch said wordlines and to simultaneously provide different operational voltages on different ones of said wordlines to accomplish a predetermined operation responsive to said procedure signal.

2. The flash memory wordline decoder of claim 1, wherein:
   said decoder circuit is configured to simultaneously provide at least three operational voltages on different ones of said wordlines to accomplish said predetermined operation responsive to said procedure signal.

3. A method of manufacturing a flash memory wordline decoder comprising the steps of:
   forming a plurality of voltage terminals to receive a plurality of voltages;
   forming a plurality of address terminals to receive a plurality of address signals;
   forming a procedure terminal to receive a procedure signal;
   forming a plurality of output wordlines adapted to be coupled to a bank of flash transistors; and
   forming a decoder circuit coupled to said voltage terminals, said address terminals and said procedure terminal and configured to decode said address signals, said decoder circuit including a plurality of latches coupled to said wordlines and configured to selectively latch said wordlines and to simultaneously provide different operational voltages on different ones of said wordlines to accomplish a predetermined operation responsive to said procedure signal.

4. The method of claim 3, wherein:
   said forming a decoder step includes the step of forming a plurality of latches each coupled to one of said wordlines and configured to simultaneously provide at least three operational voltages on different ones of said wordlines to accomplish said predetermined operation responsive to said procedure signal.

5. A method of retrieving information from a flash memory comprising the steps of:
   receiving a plurality of voltages;
   receiving a plurality of address signals;
   receiving a procedure signal;
   decoding said address;
   latching a first set of wordlines corresponding with a first set of addresses; and
   applying a first operational voltage to said first set of wordlines and applying a second operational voltage to wordlines excluded from said first set to accomplish a predetermined operation responsive to said procedure signal.

6. The method of claim 5, further comprising the step of:
   latching a second set of wordlines corresponding with a second set of addresses; and
   applying a first operational voltage to said first set of wordlines, applying a second operational voltage to said second set of wordlines and applying a third operational voltage to wordlines excluded from said first set and said second set to accomplish said predetermined operation responsive to said procedure signal.

7. A flash memory wordline decoder with overerase protection comprising:
   a plurality of voltage terminals to receive a plurality of voltages;
   a plurality of address terminals to receive a plurality of address signals;
   a procedure terminal to receive a procedure signal;
   a plurality of output wordlines adapted to be coupled to a bank of flash transistors; and
   a decoder circuit coupled to said voltage terminals, said address terminals and said procedure terminal and configured to decode said address signals, said decoder circuit including a plurality of latches coupled to said wordlines and configured to latch a first set of a plurality of said wordlines and to simultaneously apply a first voltage on said first set of wordlines and a different voltage on wordlines excluded from said first set to accomplish a predetermined operation responsive to said procedure signal.

8. The flash memory wordline decoder of claim 7, wherein:
   said decoder circuit is configured to scan said first set of wordlines to verify said predetermined operation responsive to said procedure signal.

9. The flash memory wordline decoder of claim 8, wherein:
   said decoder circuit is further configured to selectively unlatch wordlines in said first set of wordlines upon completion of said predetermined operation responsive to said procedure signal.

10. The flash memory wordline decoder of claim 7, wherein:
    said decoder circuit is configured to scan said first set of wordlines to verify said predetermined operation, and in so doing, to set all wordlines but one wordline of said first set to a voltage certain to shut off all respective cells and to set said one wordline to a verification voltage to verify whether said predetermined operation was successfully performed on cells on said one wordline.

11. The flash memory wordline decoder of claim 7, wherein:
    said predetermined operation is an erase operation;
    said first set of wordlines are erased wordlines and said wordlines excluded from said first set are unerased wordlines; and said decoder circuit is configured to scan said erased wordlines to verify said erase operation, and in so doing, to select one of said erased wordlines and to set all other erased wordlines to a voltage certain to shut off all respective cells and to set said selected wordline to a verification voltage to verify whether said erase operation was successfully preformed on cells on said selected wordline.

12. The flash memory wordline decoder of claim 11, wherein:

said decoder circuit is further configured to identify overerased wordlines from said set of erased wordlines by determining that cells on said overased wordlines are overerased, and to apply a repair voltage to said overerased wordlines to repair said wordlines by repairing cells on said overerased wordlines.

13. The flash memory wordline decoder of claim 7, wherein:

said decoder circuit is configured latch a second set of a plurality of said wordlines and to simultaneously provide a first voltage on said first set of wordlines, a second voltage on said second set of wordlines and a third voltage on wordlines excluded from said first set and said second set to accomplish said predetermined operation responsive to said procedure signal.

14. The flash memory wordline decoder of claim 13, wherein:

said decoder circuit is further configured to selectively unlatch wordlines in said first set of wordlines upon completion of said predetermined operation responsive to said procedure signal.

15. The flash memory wordline decoder of claim 7, wherein:

said decoder circuit is farther configured to perform a scan procedure wherein said decoder circuit is configured to scan said wordlines to determine a verify wordline on which to apply a verification voltage and said latches are configured to latch said verify wordline and to apply a verify voltage on said verify wordline to determine whether said predetermined operation was successful, and to apply a deselected voltage on excluded wordlines.

16. The flash memory wordline decoder of claim 15, wherein:

said decoder circuit is further configured to repair wordlines when said verification fails.

17. The flash memory wordline decoder of claim 7, wherein:

said decoder circuit is further configured to selectively unlatch wordlines in said first set of wordlines upon completion of said predetermined operation responsive to said procedure signal.

18. A method of retrieving information from a flash memory comprising the steps of:

receiving a plurality of voltages;

receiving a plurality of address signals;

receiving a procedure signal;

decoding said address;

latching a first set of a plurality of wordlines and simultaneously applying a first voltage on said first set of wordlines and a different voltage on wordlines excluded from said first set to accomplish a predetermined operation responsive to said procedure signal.

19. The method of claim 18, further comprising the step of:

scanning said first set of wordlines to verify said predetermined operation responsive to said procedure signal.

20. The method of claim 19, further comprising the step of:

selectively unlatching wordlines in said first set of wordlines upon completion of said predetermined operation responsive to said procedure signal.

21. The method of claim 18, further comprising the step of:

scanning said first set of wordlines to verify said predetermined operation, and in so doing, setting all wordlines but one wordline of said first set to a voltage certain to shut off all respective cells and setting said one wordline to a verification voltage to verify whether said predetermined operation was successfully preformed on cells on said one wordline.

22. The method of claim 18, wherein said predetermined operation is an erase operation and said first set of wordlines are erased wordlines and said wordlines excluded from said first set are unerased wordlines, further comprising the step of:

scanning said erased wordlines to verify said erase operation, and in so doing, selecting one of said erased wordlines and setting all other erased wordlines to a voltage certain to shut off all respective cells and setting said selected wordline to a verification voltage to verify whether said erase operation was successfully preformed on cells on said selected wordline.

23. The method of claim 22, further comprising the step of:

identifying overerased wordlines from said set of erased wordlines by determining that cells on said overased wordlines are overerased, and applying a repair voltage to said overerased wordlines to repair said wordlines by repairing cells on said overerased wordlines.

24. The method of claim 18, further comprising the step of:

latching a second set of a plurality of said wordlines and simultaneously providing a first voltage on said first set of wordlines, a second voltage on said second set of wordlines and a third voltage on wordlines excluded from said first set and said second set to accomplish said predetermined operation responsive to said procedure signal.

25. The method of claim 24, further comprising the step of:

selectively unlatching wordlines in said first set of wordlines upon completion of said predetermined operation responsive to said procedure signal.

26. The method of claim 18, further comprising the step of:

scanning said wordlines to determine a verify wordline on which to apply a verification voltage and latching said verify wordline and applying a verify voltage on said verify wordline to determine whether said predetermined operation was successful, and applying a deselected voltage on excluded wordlines.

27. The method of claim 26, further comprising the step of:

repairing wordlines when said verification fails.

28. The method of claim 18, further comprising the step of:

selectively unlatching wordlines in said first set of wordlines upon completion of said predetermined operation responsive to said procedure signal.

* * * * *